United States Patent [19]

Engle

[11] Patent Number: 5,557,177
[45] Date of Patent: Sep. 17, 1996

[54] ENHANCED ELECTRON BEAM ADDRESSED STORAGE TARGET

[76] Inventor: Craig D. Engle, 336 Cline Ave., Griffith, Ind. 46319

[21] Appl. No.: 183,037

[22] Filed: Jan. 18, 1994

[51] Int. Cl.$^6$ .............. G09G 1/04; H01T 29/56; G02F 1/03; G11C 13/00

[52] U.S. Cl. ............ 315/366; 315/13.11; 313/422; 359/262; 359/293; 359/47; 365/118

[58] Field of Search ................. 315/13.11, 366; 313/422; 359/262, 293, 54, 55, 47, 254, 251; 348/753, 763, 768; 365/118

[56] References Cited

U.S. PATENT DOCUMENTS

| | | | |
|---|---|---|---|
| 3,046,540 | 7/1962 | Litz et al. | 340/347 |
| 3,500,102 | 3/1970 | Crost et al. | 313/109 |
| 3,753,022 | 8/1973 | Fraser, Jr. | 313/78 |
| 3,853,391 | 12/1974 | Sorkin | 350/160 LC |
| 3,971,931 | 7/1976 | Jehle | 250/213 R |
| 3,972,587 | 8/1976 | Scheffer . | |
| 4,110,662 | 8/1978 | Greeneich et al. | 315/169 TV |
| 4,222,638 | 9/1980 | Robert | 350/96.14 |
| 4,387,964 | 6/1983 | Arrazola et al. | 350/331 R |
| 4,481,531 | 11/1984 | Warde et al. | 358/60 |
| 4,622,590 | 11/1986 | Togashi | 358/241 |
| 4,672,272 | 6/1987 | Littnin | 315/366 |
| 4,741,602 | 5/1988 | Hara et al. | 350/356 |
| 4,863,759 | 9/1989 | Warde et al. | 427/108 |
| 4,884,874 | 12/1989 | Buzak et al. | 350/336 |
| 5,036,317 | 7/1991 | Buzak | 365/118 |
| 5,130,614 | 7/1992 | Staelin | 315/366 |
| 5,196,767 | 3/1993 | Leard et al. | 315/349 |
| 5,281,887 | 1/1994 | Engle | 310/335 |
| 5,287,215 | 2/1994 | Warde et al. | 359/293 |
| 5,379,136 | 1/1995 | Hu et al. | 359/262 |

OTHER PUBLICATIONS

B. Kazan & M. Knoll, "Electronic Image Storage" p. 105, Academic Press 1968.

C. A. Spindt et al, "Field Emitter Arrays for Vacuum Microelectronics" IEEE Transactions on Electron Devices, vol. 38, No. 10, Oct. 1991.

Craig D. Engle patent application titled "Enhanced Surface Deformation Light Modulator" Ser. No. 07/953,118 filing date, Sep. 29, 1992.

Charles A. Spindt et al, "Field Emitter Arrays Applied to vacuum Fluorescent Display" IEEE Transactions on Electron Devices, vol. 36, No. 1, Jan. 1989.

A. Ghis et al, "Sealed Vaccum Devices: Fluorescent Microtip Displays" IEEE Transactions on Electron Devices, vol. 38, No. 10 Oct. 1991.

(List continued on next page.)

*Primary Examiner*—Gregory C. Issing

[57] ABSTRACT

A electron beam row at a time addressed storage target includes substrate with a plurality of column electrodes affixed to the substrate by a suitable means. Adjacent column electrodes are displaced by a first period.

The target includes a grid for collecting secondary electrons generated by bombarding the secondary electron emission means affixed to the substrate with a plurality of electron beams. Each beam strikes the target at a beam landing area. The beam landing areas of adjacent electron beams are displaced by the first period.

The beam landing areas are positioned so each beam landing area is overlapped by a respective column electrode. A respective potential difference is applied between each electrode and the grid. Charge acquired by the target at each beam landing area is dependent upon the respective potential difference applied between the electrode which overlaps the beam landing area and the grid. Charge transfer is an equilibrium process involving secondary emissions. A scan means is provided to control the position of the beam landing areas perpendicular to the first period thereby enabling the target to be row addressed. Applications of storage targets could include spatial light modulation. A suitable reflection means is provided to reflect a wavefront incident upon the target. This allows the electron beams and the wavefront to be incident on opposing surfaces of the substrate.

16 Claims, 5 Drawing Sheets

OTHER PUBLICATIONS

D. T. Gibbons, "The Barrier Grid Storage Tube", Electronic Engineering, Oct. 1961.

A. S. Jensen et al. "Barrier Grid Storage Tube and Its Operation" RCA Review.

Arthur S. Jensen, "Discharging an Insulating Surface by Secondary Emission Without Redistribution" RCA Review.

W. A. Thorton, "DC Electroluminescence in Zinc Sulfide Films", Journal of Applied Physics, vol. 33, No. 10, Oct. 1962.

J. L. Jewell et al, "Surface–Emitting Microlasers for Photonic Switching and Interchip Connections" Optical Engineering/Mar. 1990/vol. 29 No. 3.

David Casasent, "E–Beam DKDP Light Valves" Optical Engineering/vol. 17 No. 4/Jul.–Aug. 1978.

G. Marie et al, "Pockels–Effect Imaging Devices and Their Applications" Advances in Image Pick–Up and Display Devices, B. Kazan Ed. Academic Press, New York, May 1974.

Garth Gobeli and Thomas Toor, "Photoconductive Activated Light Valve for High Definition Projection System" SPIE vol. 1664 High Resolution Displays and Projection Systems (1992).

Craig D. Engle, Patent Application Titled "Enhanced Electron Beam Addresses Liquid Crystal Device" Serial No. 08/177,780 filing date Jan. 5, 1994. Abandoned.

"Development of a Spatial Light Modulator: A randomly Addressed Liquid–Crystal–Over–nmos Array" by Douglas J. McKnight et al, 15, Nov. 1989/vol. 28 No. 22, Applied Optics.

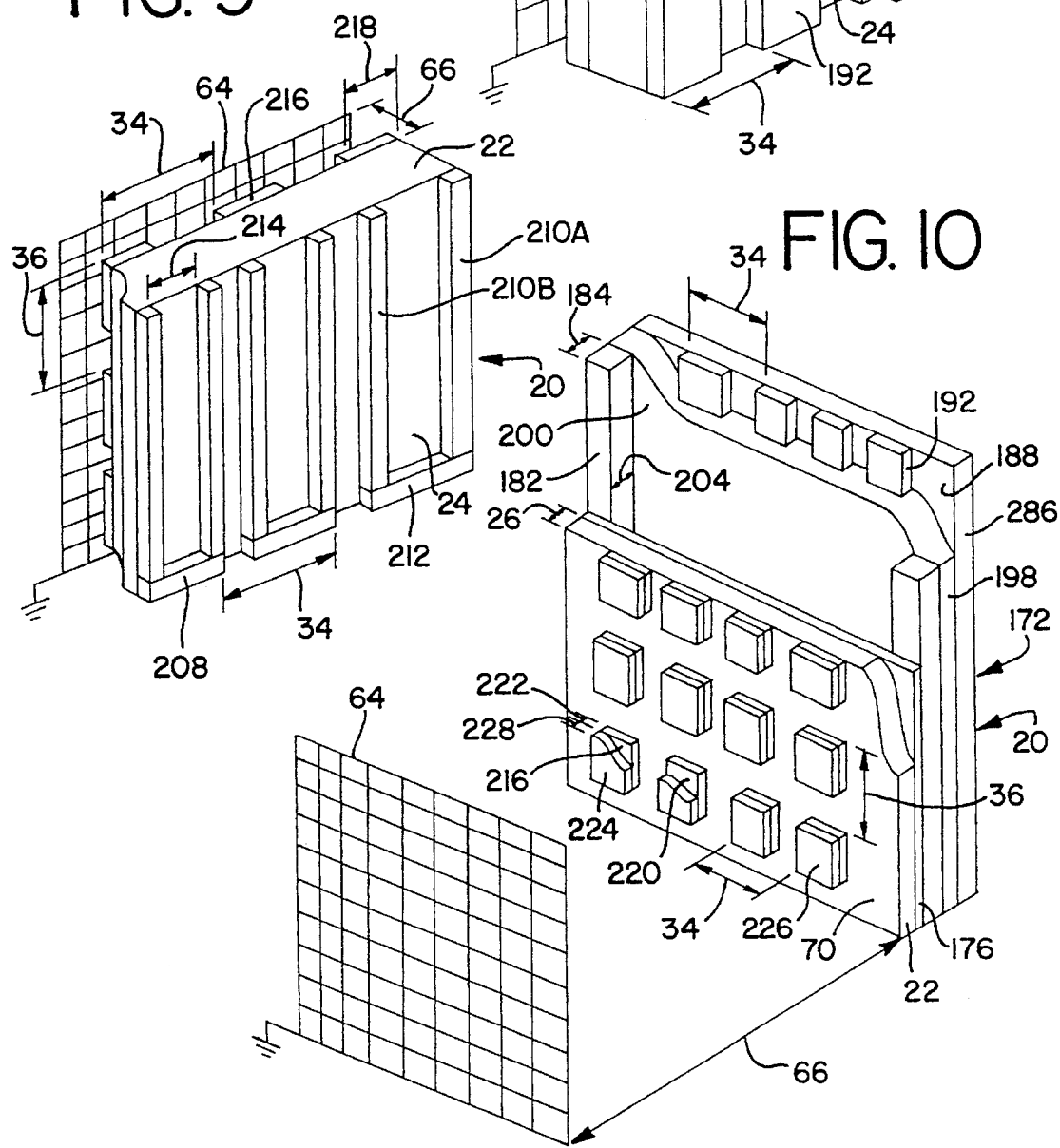

ENHANCED ELECTRON BEAM ADDRESSED STORAGE TARGET

BACKGROUND

1. Field of the Invention

This invention relates to row at a time electron beam addressed storage target configurations and their applications.

2. Prior Art

Several electron beam addressed storage target configurations have been utilized in spatial light modulator applications. See for instance U.S. Pat. No. 4,387,964 to Arrazola et al, Jun. 14, 1983.

As quoted from the book "Electronic Image Storage" by B. Kazan and M. Knoll, page 105, Section b, titled "Equilibrium Writing by Barrier-Grid (Collector) Modulation", "In operation it may not always be possible (or practical) to provide sufficient current in a single scan to shift each target element completely to the equilibrium potential." As to be shown herein, my invention utilizes row at a time addressing of the electron beam storage target. Row at a time addressing could increase the duration an electron beam bombards a particular location on a storage target as compared to serial electron beam scanning. The uninterrupted time or duration an electron beam bombards the same location on a target will be referred to herein as dwell time.

In my invention, dwell time could equal the active line time of a row addressed display. Increasing the dwell time, for a given current level, could allow more charge to be transferred to every pixel element in each row p which is being bombarded by a respective electron beam on a row at a time basis. Consequently, my invention provides latitude which could enhance the performance attainable in applications which employ electron beam addressed storage targets. Utilizing my invention, to dramatically increases the dwell time over previous implementations, could enhance a target pixel's ability to achieve an equilibrium potential within a single addressing interval.

Alternatively, by increasing the dwell time, the current necessary to achieve a desired equilibrium level could be reduced. As to be shown herein, reducing current levels in an electron beam addressed device could enhance several aspects including increasing the spatial resolution attainable in the storage target. In addition, by increasing the dwell time for a given current level, more charge could be transferred to pixel elements of the target. Consequently, my invention could extend the voltage range of storage target operation since more charge could be supplied to allow pixel elements to attain a higher voltage level. This could broaden the scope of materials suitable for use in the storage target configurations of my invention. Broadening the scope of materials suitable for use in applications involving electron beam addressed storage targets could enhance performance attainable.

Furthermore, as to be described herein, several additional benefits exist to row at a time electron beam addressing utilized in my invention. Several advantages of row at a time electron beam addressing in my invention could be similar to the benefits provided by row at a time addressing utilizing thin film transistors. Such advantages could include a reduction of the bandwidth requirements for target components. Such advantages could include reduced dimensions associated with column electrodes in the storage target of my invention. Such reductions could enhance spatial resolution.

Additional spatial light modulators configurations which involve electron beam addressing include U.S. Pat. No. 3,971,931 to Jehle, Jul. 27, 1976. U.S. Pat. No. 3,971,931 did not include an electron collector or grid in the target configuration. As to be shown herein, my invention utilizes an electron collector as part of the target to provide a storage function. Consequently, as to be described herein, my invention could enhance luminous efficiency and/or simply the write/erase process associated with updating the target.

Additional row at a time electron beam addressed spatial light modulators include U.S. Pat. No. 5,196,767 to Leard et al, Mar. 23, 1993. As identified in the article "Field-Emitter Arrays for Vacuum Microelectronics" by C. A. Spindt et al, IEEE Transactions on Electron Devices, Vol. 38, No. 10, Oct. 1991, uniformity of such arrays could be an important consideration for defining performance attainable in applications which employee field emitter arrays. As to be shown herein, by utilizing the mode of operation available with the storage target configuration of my invention, variations in emission characteristics of field emitter arrays, or for that matter any electron beam source compatible with the addressing requirements of my invention, could manifest themselves as a variations in the charging time to achieve a desired potential difference across a target pixel. If the dwell time is at least as large as the maximum charge time, due to the lowest emission emitter and largest potential difference to charge, then such variations would be reduced in their effect, since the desired value is established within a row period and is essentially maintained for the remaining frame time. This is in contradistinction to spatial light modulators which utilize field emitter arrays, and interface field emitter arrays to electron beam addressed targets which incorporate different writing methods to achieve storage. Consequently, the storage target configurations of my invention could provide several benefits including enhanced luminous efficiency due to storage, improved uniformity of targets which are interfaced to row addressed electron beam sources while relieving the performance demands placed on row addressed electron beam source arrays, provide addressing convenience by combining the write/erase functions and extending the realm of high voltage target operation and/or enhancing the spatial resolution attainable in the target.

Additional electron beam addressed devices include U.S. Pat. No. 4,884,874 to Buzak et al, Dec. 5, 1989. Utilization of two electron beam guns fails to combine the write/erase functions and complicates packaging considerations of the spatial light modulator. As to be shown herein, several electron beam sources exist which are compatible with the row at a time addressing sequence of my invention and which could enhance packaging of spatial light modulators. Such sources include field emitter arrays. Relative packaging advantages of field emitter arrays are identified in U.S. Pat. No. 3,500,102 to M. E. Crost et al, Mar. 10, 1970.

OBJECTS AND ADVANTAGES

Accordingly, several objects and advantages of my invention include:

1) To identify how to configure an electron beam addressed storage target which utilizes a plurality of column electrodes affixed to the target by a suitable means for row at a time addressing.

2) To identify a variety of row at a time electron beam addressed storage target configurations.

3) To identify advantages of utilizing the row at a time electron beam addressed storage targets of my invention.

4) To show how dwell time of row at a time electron beam addressing is increased and how this could enhance achieving a desired potential difference at a target pixel location and/or increasing the possible target configurations which could be employed with my invention.

5) To identify several electron beam sources which could be utilized with the storage target of my invention.

6) To show how my invention could enhance performance characteristics of spatial light modulators utilizing my invention and how my invention could relieve performance demands associated with electron beam sources, thereby enhancing commercial viability of spatial light modulator systems utilizing my invention.

7) To show how my invention could enhance packaging considerations of electron beam addressed spatial light modulators.

Further objects and advantages of my invention will become apparent from a consideration of the drawings and ensuing description of it.

DESCRIPTION OF DRAWINGS

In the drawings, closely related figures have the same number but different alphabetic suffixes.

FIG. 6 shows a microchannel plate interface for use in row addressing my invention.

FIG. 7 shows a row at a time electron beam addressed storage target configured as a liquid crystal cell for use in varying the polarization state of an incident electromagnetic wavefront.

FIG. 8 shows a storage target utilizing an electro-optic substrate.

FIG. 9 shows a storage target utilizing an electro-optic substrate.

FIG. 10 shows a second liquid crystal electron beam addressed storage target.

DESCRIPTION OF INVENTION

Figure 1:
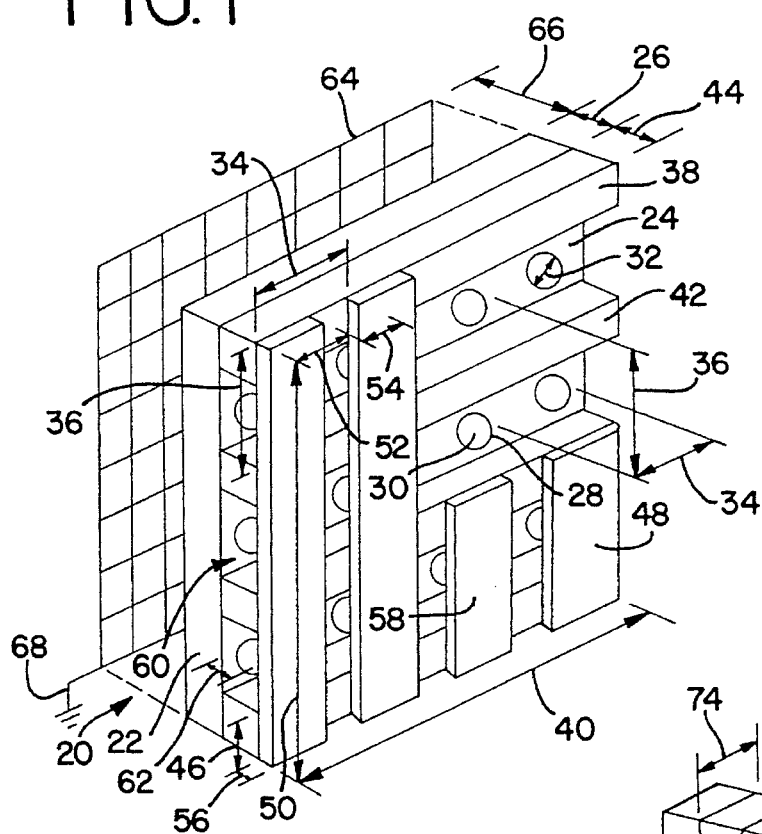
FIG. 1 shows an electron beam addressed storage target with a plurality of column electrodes affixed to the target.

FIG. 1 shows a storage target 20 configured to modulate the phase of an electromagnetic wavefront incident thereon. As to be shown herein, target 20 could be configured to vary other properties of an electromagnetic wavefront, such as the polarization state of an incident wavefront. Target 20 further includes a target substrate 22. Substrate 22 could be fabricated from an insulating material. Suitable insulating materials could include a photomachinable glass. Photomachinable glasses are well understood by those knowledgeable in the state of the art. As to be shown herein, depending upon the target configuration, alternative materials could be utilized for the substrate. Alternative materials could include electro-optic materials. The wavefront is not shown in the figure.

Substrate 22 further includes a first major surface 24 and a second major surface. The second major surface is not visible in the figure. The second major surface and surface 24 are essentially parallel planes separated by a substrate thickness 26. Thickness 26 is perpendicular to surface 24.

Affixed to substrate 22 by a suitable means is a plurality of conductive feedthroughs 28 arranged into a matrix of p rows and q columns. Each feedthrough 28 further includes a first end face 30 and a second end face. The second end faces are not visible in the figure. Each feedthrough 28 further includes a diameter 32. Diameter 32 is perpendicular to thickness 26.

Feedthroughs 28 are fabricated so face 30 of each feedthrough 28 is coplanar with surface 24 and the second end face of each feedthrough 28 is coplanar with the second major surface of substrate 24. Constructing conductive feedthroughs so that each end face is coplanar with a respective major surface of the substrate allows an localized equalpotential to be established on both major surfaces of the substrate. Techniques for fabricating a substrate containing feedthroughs and material suitable for use as a target substrate are well understood by those knowledgeable in the state of the art. Information concerning the fabrication of feedthroughs can be found in U.S. Pat. No. 4,863,759 to Warde et al, Sep. 5, 1989.

Adjacent feedthroughs 28 in each row p are displace by a first period 34. Period 34 is perpendicular to thickness 26. Adjacent feedthroughs 28 in each column q are displaced by a second period 36. Period 36 is perpendicular to period 34 and thickness 26.

Target 20 further includes a plurality of ridges 38 affixed to surface 24 by a suitable means. As well understood by those knowledgeable in the state of the art, ridges 38 could be selectively etched in a photomachinable glass substrate. Etching ridges in a substrate is a suitable means to affix ridges to a substrate. Adjacent ridges 38 are displaced by period 36. Each ridge 38 spans a first target dimension 40. Dimension 40 is parallel to period 34. Each ridge 38 further includes a ridge crown surface 42. Surface 42 is essentially parallel to surface 24. Surface 42 is separated from surface 24 by a ridge height 44. Height 44 is parallel to thickness 26. Each ridge further includes a width 46. Width 46 is parallel to period 36.

Affixed to crown surface 42 of every ridge 38 is a plurality of reflective, deformable column electrodes 48. Ridges 38 are a suitable means to affix electrodes 48 to substrate 22. As to be described herein, alternative suitable means exist to affix electrodes 48 to substrate 22. Additional information concerning fabrication of column electrodes suitable for use in the storage target of my invention can be found in the patent application admitted to Craig D. Engle titled "Enhanced Surface Deformation Light Modulator" Ser. No. 07/953,118, filing date Sep. 29, 1992. Requiring each electrode 48 to be reflective provides target 20 with a suitable reflective means. As to be shown herein, alternative techniques exist to provide target 20 with a reflective means. In addition, as to be shown herein, target configurations exist which could employ transmissive column electrodes.

Each column q of feedthroughs 28 is overlapped by a respective electrode 48. Adjacent electrodes 48 are displaced by period 34. Each electrode 48 spans a second target dimension 50. Dimension 50 is parallel to period 36. Each electrode 48 further includes an electrode width 52. Width 52 is parallel to period 34. Adjacent electrodes 48 are separated by a gap 54. Gap 54 is parallel to period 34. Each electrode 48 further includes an electrode thickness 56. Thickness 56 measures the separation distance between a first electrode surface 58 and a second electrode surface of the electrode 48. Materials and methods for fabricating column electrodes are well understood by those knowledgeable in the state of the art. The second surfaces of electrodes 48 are not visible in the figure.

Each feedthrough 28 and the respective electrode 48 overlapping the feedthrough 28 form a respective target pixel 60. As well understood by those knowledgeable in the state of the art, each pixel 60 could be modeled as a capacitor.

In an unenergized state, surface 58 of the respective electrode 48 overlapping the feedthrough 28 of a pixel 60 is essentially parallel to surface 24.

As well understood by those knowledgeable in the state of the art, applying a potential difference to a pixel 60 generates electrostatic forces in the pixel 60 which lead to localized deformations of the respective electrode 48 overlapping feedthrough 28 of the pixel 60. Relationships governing the behavior between the potential difference applied to a pixel and the localized deformations of the electrode overlapping the feedthrough of the pixel are well understood by those knowledgeable in the state of the art. Varying the potential difference applied to a pixel 60 varies a separation distance 62 between surface 24 and surface 58 of the respective electrode 48 in the vicinity of the feedthrough 28 of the pixel 60 thereby establishing a localized deformation of the electrode 48. As well understood by those knowledgeable in the state of the art, varying the localized surface deformation of the respective electrode 48 of a pixel 60 is a suitable modulation means to vary a property of an electromagnetic wavefront. As well understood by those knowledgeable in the state of the art, varying the surface deformation of a pixel varies the phase of the electromagnetic wavefront. As to be shown herein, alternative target configurations could vary properties other than the phase. Other properties of an electromagnetic wavefront which could be varied by the storage target embodiments of my invention column electrodes polarization.

Utilization of ridges and adjacent column electrodes separated by a gap leads to boundary conditions on each electrode which allow the deformations to be localized. Overlapping each feedthrough with a respective electrode further influences localizing a deformation. As to be identified herein, additional considerations exist which could influence how the response of each pixel in the storage target configurations of my invention are localized. Positioning of electrodes so each column q of feedthroughs is overlapped by a respective electrode is a suitable relative positioning means to establish a localized response between each feedthrough and the respective electrode in the storage target. As to be shown herein, alternative geometries could be utilized for column electrodes. Such geometries will effect the relative positioning required to establish a localized response in the target.

Target 20 further includes an electron collector grid 64. Grid 64 is separated from the second surface of substrate 22 by a grid distance 66. Grid 64 is maintained at a fixed electrical potential due to ground interconnect 68. As to be described herein, distance 66 is chosen so grid 64 collects secondary electrons front target 20.

Figure 2:
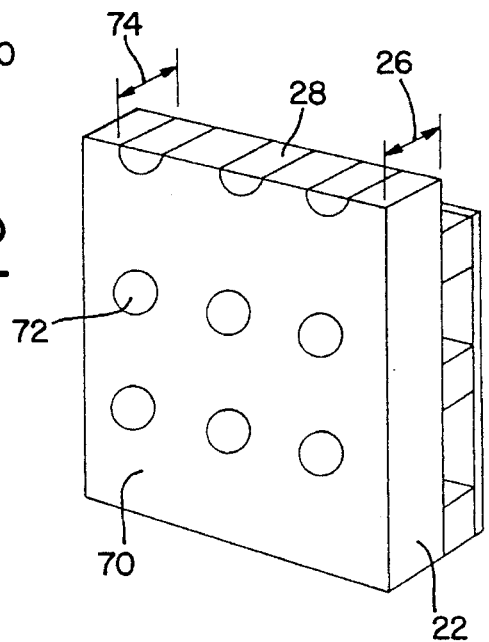
FIG. 2 shows a second surface perspective of an electron beam addressed storage target utilized in my invention.

FIG. 2 shows a second surface 70 perspective of substrate 22. Each feedthrough 28 further includes a second face 72. Each feedthrough 28 further includes a feedthrough length 74. Feedthrough length 74 is equal to and parallel to thickness 26. Substrate 22 has been shown cut away to reveal features of feedthroughs 28. Feedthroughs 28 are fabricated so face 72 of every feedthrough 28 is coplanar with face 70 of substrate 22. Constructing feedthroughs so the end face of each feedthrough is coplanar with a respective surface of the target substrate is a suitable means to affix feedthroughs to the substrate.

Figure 3:
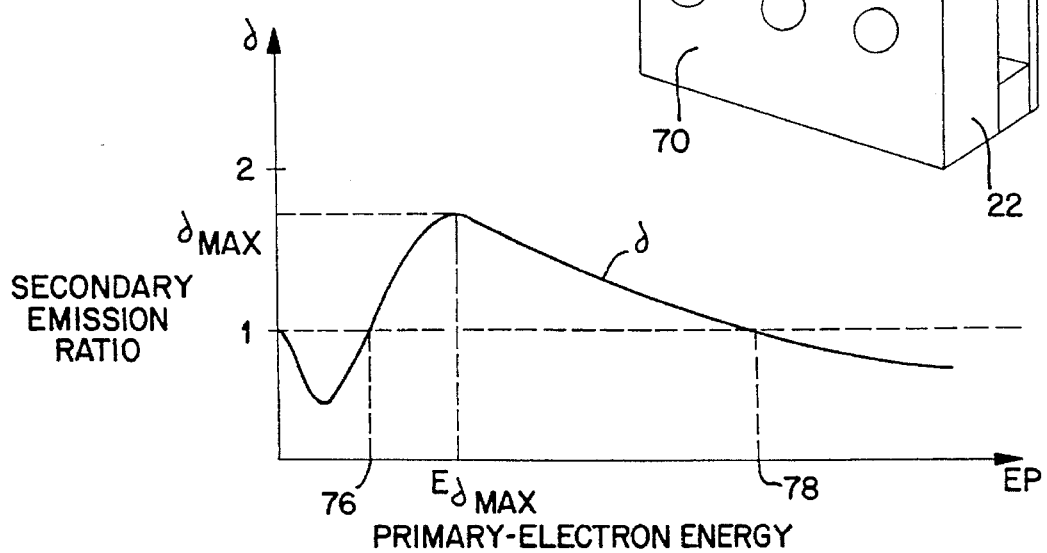
FIG. 3 shows a secondary electron emissions ratio curve as a function of primary electron energy which is characteristic of the secondary emission means utilized in my invention.

Operation of the row at a time electron beam addressed storage target of my invention is dependent on the secondary electron emission ratio characteristics of the feedthroughs. A generalized secondary electron emissions ratio curve &, characteristic of each feedthrough, as a function of primary electron energy EP, of the electrons bombarding the feedthrough, is shown in FIG. 3. Curve & exhibits a first crossover point 76 and a second crossover point 78. The secondary emissions ratio & exceeds unity between crossover point 76 and second crossover point 78 and includes a maximum emissions ratio &max which occurs at energy E&max. Embedding feedthroughs in the target substrate of my invention is a suitable means to provide the target with a secondary electron emission means. As to be identified herein, alternative suitable secondary electron emission means could be utilized with the storage target configuration of my invention.

Figure 4:
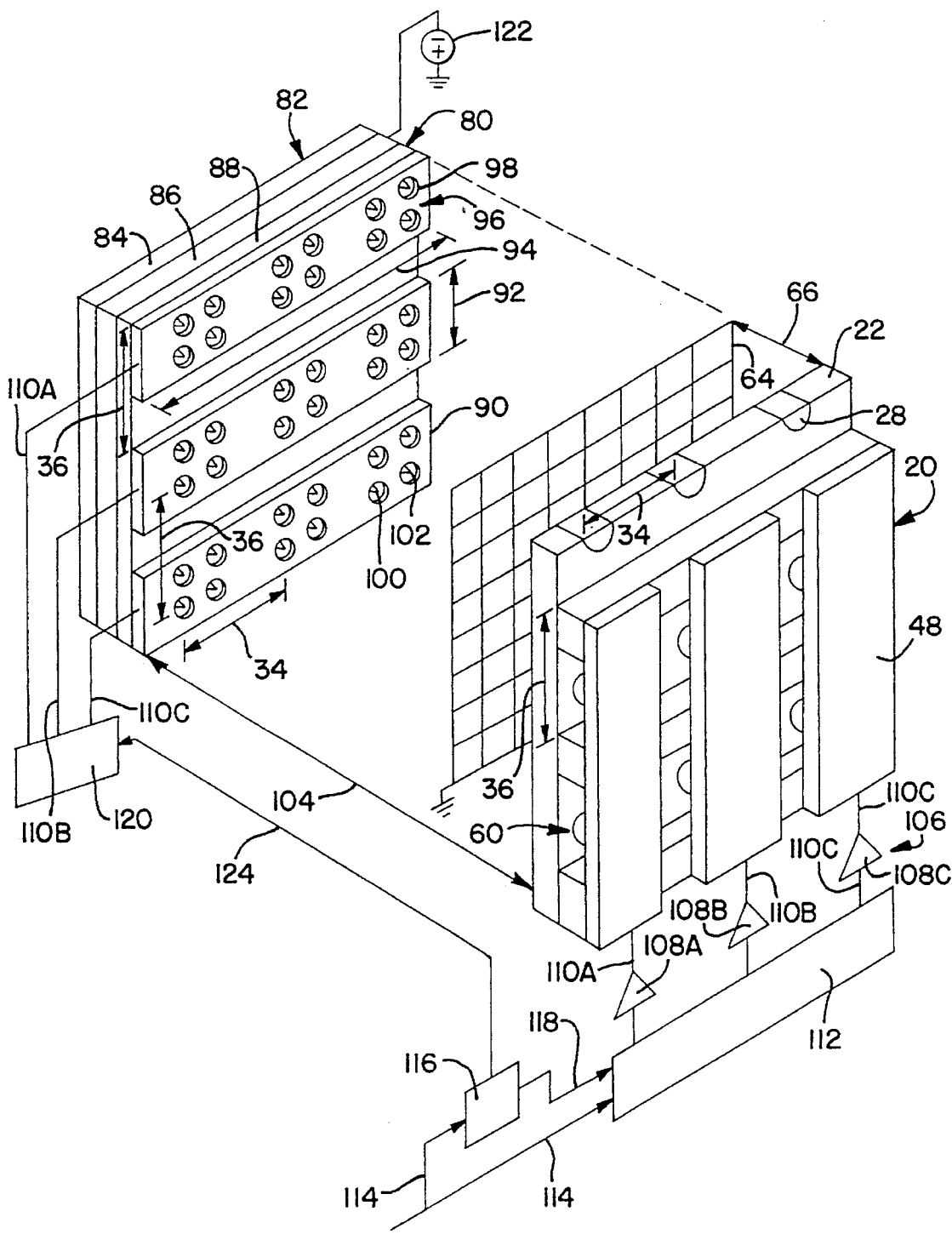
FIG. 4 shows a suitable electron beam means for row addressing my invention.

Operation of the storage target of my invention is now discussed. FIG. 4 shows a suitable electron beam means 80 for generating a plurality of electron beams for use in bombarding the second face of every feedthrough 28 in each row p of storage target 20 on a row at a time basis. Electron beams are not shown in the figure. Means 80 further includes a row addressed field emitter array 82. Array 82 further includes a base substrate 84. Affixed to substrate 84 by a suitable means is a conductive slab 86. Affixed to conductive slab 86 by a suitable means is an insulating layer 88. Affixed to layer 88 is a plurality of row conductors 90. Adjacent conductors 90 are displaced by second period 36. Each conductor 90 further includes a conductor width 92. Width 92 is parallel to period 36. Each conductor 90 further includes a conductor length 94. Length 94 is parallel to period 34.

Array 82 further includes a plurality of electron beam sources 96. Adjacent sources 96 in each row p are displaced by period 34. Adjacent sources 96 in each column q are displaced by second period 36. Every source 96 in each row p is straddled by a respective row conductor 90. Each source 96 further includes a 2×2 matrix of holes 98. Each hole 98 extends through the respective conductor 90 and insulating layer 88. A field emission cone 100 is fabricated in each hole 98, the base of each cone 100 making contact with conductive slab 86 and a tip 102 of each cone 100 terminating in the plane of the respective row conductor 90. The bases of the cones 100 are not visible in the figure. Utilization of row conductors with a monolithic conductive slab yields a row addressed field emitter array.

Dimensions for substrate, electrodes, material selection and operating characteristics are well known for field emitter arrays. See for instance information contained in the article "Field-Emitter Arrays for Vacuum Microelectronics" by C. A. Spindt et al, IEEE Transactions on Electron Devices, Vol. 38, No. 10, Oct., 1991. "Field Emitter Arrays Applied to Vacuum Fluorescent Display" by Charles A. Spindt et al, IEEE Transactions on Electron Devices, Vol. 36, No. 1 Jan. 1989, and "Sealed Vaccum Devices: Florescent Microtip Displays" by A. Ghis, et al, IEEE Transactions on Electron Devices, Vol. 38, No. 10, Oct. 1991.

Electrodes and cones could be fabricated from molybdenum, silicon dioxide could be utilized for the insulating layer, silicon could be utilized for the conductive slab and glass could be utilized for the substrate.

Utilizing row conductive with the field emitter array as in my invention avoids the requirement of having crossing conductors similar to the two degree of freedom addressed field emitter array of U.S. Pat. No. 5,196,767. The storage target configuration of my invention distributes addressing component between the electron beam means and the storage target thereby relieving demands placed on the field emitter array while simultaneously providing several benefits to be described herein. Such techniques could enhance the reliability of spatial light modulators which utilize my invention.

Array 82 is separated from the second surface of substrate 22 by a proximity focus distance 104. Maintaining distance 104 relatively small allows electron beams emitted from the sources 96 of array 82 to be proximity focused onto target 20. As well understood by those knowledgeable in the state of the art, alternative focusing means exist and could include additional electrode structuring in array 82.

Array 82 is positioned relative to substrate 22 so each source 96 is overlapped by the second face of a respective feedthrough 28. Due to the periodic natures of the sources 96 in array 82 and the periodic arrangement of feedthroughs 28 in substrate 22 and relative positioning between array 82 and target 20, each row conductor 90 is overlapped by a respective row p of feedthroughs 28. Positioning array 82 relative top target 20 and the use of proximity focusing enables the plurality of electron beams emitted from each row p of sources 96 to bombard the second face of every feedthrough 28 in a respective row p of feedthroughs 28 in parallel. The terminology "in parallel" is employed to denote that the second face of every feedthrough 28 in the row p of feedthroughs 28 being bombarded are being bombarded simultaneously with a respective electron beam. The second faces of the feedthroughs and the second surface of the substrate are not visible in the figure.

As to be described herein, it is believed that bombarding the second face of every feedthrough 28 in a respective row p of feedthroughs 28 with a respective electron beam, in parallel, allows localized responses to be established, in parallel, in the storage target 20 of my invention.

Means 80 further includes a suitable potential control means 106 to apply, in parallel, a respective potential difference between each electrode 48 and grid 64. Potential control means 106 further includes each electrode 48 being electrically connected to a respective column drive amplifier 108 by a general purpose electrical interconnect 110. Each amplifier 108 is electrically connected to a shift register means 112 by a general purpose electrical interconnect 110. A video signal 114 is applied to a clock means 116 and shift register means 112. Clock means 116 applies a first synchronization signal 118 to shift register means 112. In response to signal 118, shift register means 112 samples signal 114 and transfer, in parallel, each video sample to a respective amplifier 108. Details of video sampling, parallel transfer, etc are well understood by those knowledgeable in the state of the art, and are not shown in detail. Timing relationships involving sampling times, transfers intervals, etc will be described herein.

Due to scaling considerations associated with the gain of each amplifier 108 and the value of the sample applied to it, each amplifier 108 establishes a respective potential difference between grid 64 and the electrode 48 connected to it. Use of a shift register and clock means, along with maintaining grid at a constant potential, is a suitable potential control means for applying a respective potential difference between each electrode 48 and grid 64. Techniques for sampling and distributing video samples to column drive amplifiers, for generating a respective potential difference between each column electrode and the grid are similar to technique developed for use in active matrix addressed displays. See for instance U.S. Pat. No. 4,622,590 to Togashi, Nov. 11, 1986, FIG. 3 prior art, and U.S. Pat. No. 4,110,662 to Greeneich et al, Aug. 29, 1978.

Each row conductor 90 is electrically connected to a row decode module 120 by a general purpose interconnect 110. An acceleration potential source 122 is applied to conductive slab 86 to accelerate primary electrons, which are emitted by the source 96 of array 82, when activated, to an energy level which lies between the first crossover point and the second crossover point on the characteristic secondary electron emission ratio curve of the feedthroughs 28. Applying accelerating potentials to generate primary electron with a energy which lies between the first crossover point and the second crossover point is essential for establishing an equilibrium potential, by a suitable equilibrium writing means due to a secondary emissions process, between the second face of every feedthrough 28 in a respective row p of feedthroughs 28 being bombarded and grid 64.

Separation distance 66 is chosen so grid 64 can collect secondary electrons emitted by every feedthrough 28. Clock means 116 distributes a second synchronization signal 124 to module 120.

Additional components required by the suitable electron beam means 80 to operate the storage target of my invention include a vacuum envelope. Vacuum envelopes, suitable for use for packaging field emitter arrays and spatial light modulator components are supplied in the references cited herein. Similar vacuum housing technique could be employed with my invention. Such techniques are well understood by those knowledgeable in the state of the art and are not shown in the figure for convenience.

The suitable potential control means 106 could be contained, within the vacuum envelope. The column drive amplifiers could be affixed to the substrate, by increasing the dimension of the substrate to accommodate the components. This could reduce the number of electrical interconnects that must pass through the vacuum housing. Including the potential control means components within the vacuum housing could enhance reliability. Such techniques are well understood by those knowledgeable in the state of the art and are not shown. As well understood by those knowledgeable in the state of the art, substrates containing feedthroughs have severed as vacuum faceplate seals in prior electron beam addressed spatial light modulator art. Consequently, for the storage target 20 illustrated in FIG. 4, suitable potential control means 106 could be external to the vacuum housing without adversely effecting the reliability of this target configuration.

After a respective potential difference is established, in parallel, between each electrode 48 and grid 64, due to the operation of the potential control means 106, row decode module 120 applies a beam current control voltage signal, of a particular magnitude, to a selected conductor 90 as a response to signal 124. As a result, the row p of sources 96 straddled by the selected conductor 90 emit electron beams. Each source 96 in the selected row p of sources 96 in array 82 emits an electron beam based upon field emission phenomena. Information concerning field emission phenomena and the current levels generated due to a particular signal magnitude applied between the conductive slab and the selected row conductor are provided in the reference cited herein. Applying a current control voltage signal of an appropriate magnitude to a selected conductor 90 to enable field emissions from the row p of source 96 is a suitable means for controlling the beam current of each electron beam.

As to be shown herein, due to increasing the dwell time by row addressing the electron beam storage target of my invention, considerable latitude exists in establishing a suitable value for the beam current of each electron beam. Suitable values for beam current are dependent upon the particular configuration of the storage target. Suitable beam currents can be determined by those knowledgeable in the state of the art.

Information concerning row decoders and techniques to enable row decoders to activate field emissions form the source straddled by a selected conductor, from among a plurality of conductors electrically connected to the decoder, as a response of a synchronization signal applied to it, are well understood by those knowledgeable in the state of the art. Information concerning row decoders are provided in the reference cited herein.

The plurality of electron beams emitted from the selected row p of sources 96 is accelerated toward target 20 due to the acceleration potential created by source 122. Due to relative positioning, proximity focusing, etc, each source 96 in the selected row p of sources 96 in array 82 is overlapped by the second face of a respective feedthrough 28 in a respective row p of feedthroughs 28. Each electron beam bombarding target 20 strikes target 20 at a beam landing area. The beam landing areas and the second faces of the feedthroughs 28 are not visible in the figure. Relative positioning and proximity focusing, along with the periodic nature of sources 96 in array 82 and feedthroughs 28 in target 20 ensure that the beam landing area of each electron beam bombarding target 20 coincides with the second face of the respective feedthrough 28 which overlaps the source 96 emitting the electron beam. Proximity focusing insures that the beam landing areas of adjacent electron beams are displaced by period 34.

The current control voltage signal is applied to the selected conductor 90 for a duration referred to as the dwell time. After the dwell time expires, module 120 return the potential applied to the selected row conductor 90 to the same potential applied to the conductive slab 86. This eliminates field emissions, thereby "turning off" the electron beam sources.

As well understood by those knowledgeable in the state of the art, bombarding an isolated target with an electron beam could allow an equilibrium potential to be established between the area on the target being bombarded and an electron collector or grid. In my invention, due in part to positioning of each source in the field emitter array relative to the target, as described herein, the beam landing area of each electron beam bombarding the target coincides with the second face of the feedthrough overlapping the source. Since each feedthrough in each row p is overlapped by a respective electrode, the beam landing area of each electron beam is overlapped by a respective electrode.

It is believe that relative positioning of array 82 and target 20, along with each column q of feedthroughs 28 being overlapped by a respective electrode, so that the beam landing area of each electron beam is overlapped by the respective electrode enables a localized response to be established in target 20 between the beam landing area of each electron beam and the respective electrode overlapping the beam landing area. Relative positioning so the beam landing area of each electron beam is overlapped by a respective electrode is due in part to the geometry of the column electrode. As to be shown herein, alternative electrode geometries exist and could effect the relative positioning required between the beam landing area and a respective electrode so as to establish a localized response in the target between each beam landing area and a respective column electrode.

It is believed that due, in part, to the nature of the acceleration potential and the secondary emission ratio characteristics of the feedthroughs, an equilibrium potential will be established, in parallel, between the second face of every feedthroughs 28 in the row p of feedthroughs 28 being bombarded by a respective electron beam and grid 64. The equilibrium potential is established by an equilibrium potential writing means utilizing secondary emissions. Information concerning equilibrium writing means can be found in the reference titled "The Barrier Grid Storage Tube" by D. J. Gibbons, Electronic Engineering, Oct. 1961, "Barrier Grid Storage Tube and Its Operation", by A. S. Jensen et al, RCA Review, "Discharging An Insulator Surface By Secondary Emission without Redistribution" by Arthrur S. Jensen, RCA Review.

Synchronizing the activation of a selected row conductor 90 relative to the application of the respective potential difference between each electrode 48 and grid 64 is an important consideration. Suitable potential control means 106 establishes a respective potential difference between each electrode 48 and grid 64. Due to capacitive coupling in target 20 and positioning of each column q of feedthroughs 28 relative to a respective column electrode 48, the potential of every feedthrough 28 overlapped by a respective electrode 48 will be effected by any changes in the respective potential difference between the electrode 48 overlapping the column q of feedthroughs 28 and grid 64.

After updating, in parallel, the respective potential difference between each electrode 48 and grid 64, a current control voltage signal is applied to a selected row conductor 90 to activate the row p of sources 96 straddled by the selected conductor 90 to emit electron beams with a desired beam current.

As described herein, it is believed that each feedthrough 28 being bombarded by a respective electron beam could be shifted to an equilibrium potential, in parallel, relative to grid 64 by a suitable equilibrium means that involves bombarding the target area with primary electrons that possess energies that lie between the first crossover point and the second crossover point of the secondary electron emission ratio curve of the feedthroughs. Consequently, a charge will be deposited at the beam landing area of each electron beam which is dependent upon the potential difference which exists between grid 64 and the electrode 48 which overlaps the beam landing area. Since a row p of sources 96 are activated at a time, each feedthrough 28 in the respective row p of feedthroughs 28 which overlaps the activated row p of sources 96 will acquire a charge dependent upon the respective potential difference between the column electrode 48 which overlaps the feedthrough 28 and grid 64. Consequently, charge stored in a row p of feedthroughs 28 is dependent upon the potential difference between each respective electrode 48 and grid 64. Upon returning the current control voltage signal back to the same potential as applied to conductive slab of the field emitter array, to eliminate the array from emitting electron beams, the sequence may be repeated.

By bombarding each row p of feedthroughs 28, in a particular sequence, which could be a consecutive sequence, by activating a row p of sources 96 which is overlapped by a respective row p of feedthroughs, localized response between the beam landing area of each electron beam and the respective electrode 48 overlapping the beam landing area of an electron beam can be established in target 20 on a row at a time basis.

A distinguishing feature of my invention is that the target acquires, in parallel, a charge which is dependent upon the respective potential difference between each electrode 48 an grid 64. As to be shown herein, this feature provides several advantages. This includes the ability to bombard every feedthrough 28 in each row p for an entire active line time.

Allowing each pixel 60 in the row p of feedthroughs 28 being bombarded to charge to a potential difference which is related to the respective potential difference between grid 64 and the electrode 48 which overlaps the feedthrough 28 being bombarded, establishes a localized respective electric field in each pixel 60. This is attributed to the charge which is deposited at the beam leaning area of each electron beam. Electric fields and/or electric field lines are not shown in the figure for convenience. Depending upon the nature of the target configuration, varying each respective electric field will vary a property of the incident electromagnetic wavefront by a suitable modulation means. Due to the relative positioning of each row p of sources 96 in the array 82 relative to a respective row p of feedthroughs 28, applying a beam current control voltage signal to consecutive row conductors 90, in the sequence described above, allows the beam landing areas of the plurality electron beams bombarding target 20 to be positioned along target 20 in a direction parallel to period 36 while maintaining the same relative lateral position, ie the dimensions parallel to period 34, between the beam landing area of each electron beam and the respective electrode 48 overlapping the beam landing area. This maintains the capability to generate a localized response between the beam landing area in each column q and the respective electrode 48 overlapping the column q of beam landing areas. Due to the periodic arrangement of feedthroughs, beam landing areas are positioned to new locations which are moved in a direction parallel to period 36. Sequentially activating consecutive row conductors 90, to control the beam landing area of every electron beam bombarding target 20 is a suitable beam scanning means. As to be shown herein, alternative beam scanning means exist to position the beam landing area of every electron beam bombarding the target while maintaining the overlap of each beam landing area in each column q with the respective electrode 48.

As described herein, activation of each row conductor must be synchronized with applying the respective potential difference between each electrode and the grid. Distributing a second synchronization signal to the row decoder enables the beam current controlling voltage signal to be properly sequenced relative to the application of the respective potential difference between each electrode and the grid. The clock means distributing synchronizing signals to the row decoder and the shift register means is a suitable means for synchronizing the beam current means and the beam scanning means with the potential control means.

Techniques for fabricating row decoders are well understood by those knowledgeable in the state of the art. Decoder modules could be located within a vacuum housing to reduce the number of interconnects that must pass through the vacuum housing. Similar considerations apply to the clock means. Such considerations are well understood by those knowledgeable in the state of the art.

FIGS. 5a thru 5G show time lines of operation for the storage target of my invention. FIGS. 5A thru 5G are phased so that the time lines shown in FIGS. 5A thru 5E are referenced to a common origin O. This will facilitate interpretation of FIG. 5A thru 5G.

Figure 5:
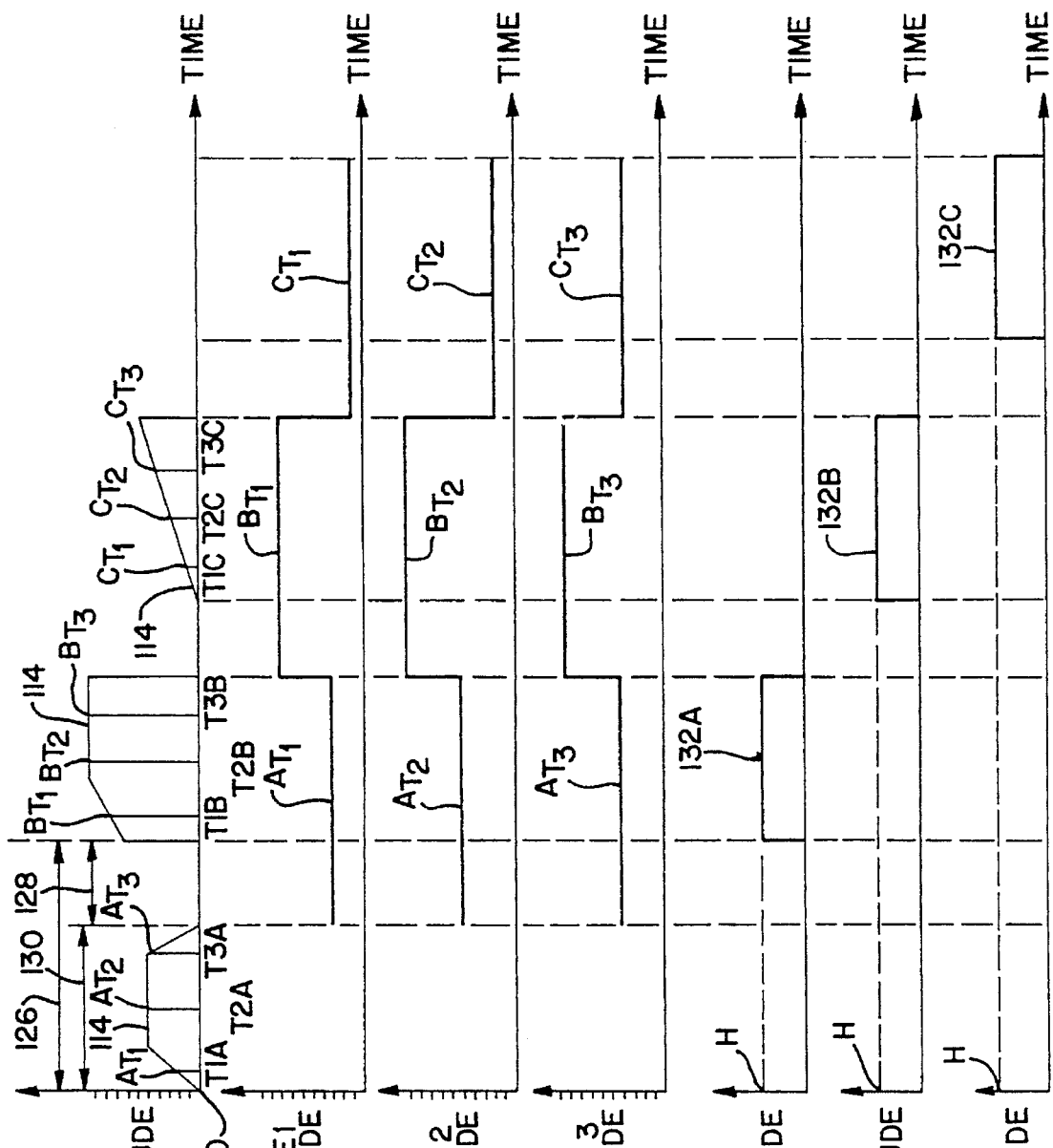
FIG. 5A shows a time line of operation for a row addressing sequence employed in my invention.
FIG. 5B shows a time line of operation for the storage target of my invention.
FIG. 5C shows a time line of operation for the storage target of my invention.
FIG. 5D shows a time line of operation for the storage target of my invention.
FIG. 5E shows a time line of operation for the storage target of my invention.
FIG. 5F shows a time line of operation for the storage target of my invention.
FIG. 5G shows a time line of operation for the storage target of my invention.

FIG. 5A shows a video signal 114 periodic with a video period 126. Three video periods 126 are shown, with letters A, B, and C representing respective consecutive periods 126. Each period 126 further includes a blanking interval 128 and an active interval 130. During each active interval 130, video signal 114 is sampled at times T1, T2, T3. Each sample time T1, T2, T3, is subscripted with the letter representing the period 126 in which the sample was taken.

The amplitude of video signal 114 at a particular sampling time T1, T2, T3, is indicated by subscripting the letter representing the period 126 with the sample time, i.e. AT1, AT2, AT3,. During each active interval 130, video signal 114 is sampled and latched by the shift register means. Shift register means is not shown in the figure.

During each blanding interval 128, the shift register transfers in parallel, each sample acquired during the active interval 130 of the same period 126 to a respective column drive amplifier. The column drive amplifiers are not shown in the figure.

FIG. 5B shows the amplitude of sample values T1, taken from three amplifier periods 126, which are applied to a respective column drive amplifier 108A. Amplifier 108A is not shown in the figure. Consequently, due in part to the scaling effects associated with the gain of the amplifier, a respective potential difference is applied between the electrode electrically connected to that column drive amplifier and the grid which is dependent, in part, on the amplitude of the sample applied to the column amplifier. Column drive amplifiers, grid, electrodes, etc are not shown in the figure.

FIG. 5C shows the amplitude of sample values T2, taken from three consecutive periods 126, which are applied to a respective column drive amplifier 108B by the shift register means. Amplifier 108B and the shift register means are not shown in the figure. Consequently, due in part to scaling effects associated with the gain of the amplifier, a respective potential difference exist between the electrode which is electrically connected to that amplifier and the grid which is dependent, in part, on the amplitude of the sample applied to the column amplifier. Column drive amplifiers, grid, electrodes, etc are not shown in the figure.

FIG. 5D shows the amplitude of sample values T3, taken from three consecutive periods 126, which are applied to a respective column drive amplifier 108C by the shift register means. Amplifier 108C and the shift register means are not shown in the figure. Consequently, due in part with to the scaling effect associated with the gain of the amplifier, a respective potential difference exist between the electrode which is electrically connected to that amplifier and the grid which is dependent, in part, on the amplitude of the sample T3 applied to that column amplifier. Column drive amplifiers, grid, electrodes, etc are not shown in the figure.

It is assumed that the transfer of each sample to a respective column drive amplifier from the shift register means occurs in parallel and during the blanking interval of the period during which the samples were acquired from the video signal 114. Furthermore the parallel transfer establishes a steady state level prior to and during the next active interval, i.e., the respective potential difference applied between each electrode and the grid during a blanking interval is assumed constant for the following active interval.

These aspects are emphasized by having FIG. 5A thru 5G phased to a common origin O.

FIG. 5E shows a current control voltage signal 132A of magnitude of "H" which is applied to row conductor 90A by the row decode module. The row decoder module and conductor 90A are not shown in the figure.

FIG. 5F shows a current control voltage signal 132B with a magnitude of "H" which is applied to row conductor 90B by the row decoder module. The row decoder module and conductor 90B are not shown in the figure.

FIG. 5G shows a current control voltage signal 132C with a magnitude "H" which is applied to row conductor 90C by the row decoder module. The row decoder module and conductor 90C are not shown in the figure.

Due to the common phasing of FIG. 5A thru 5G, it is apparent that the row decoder module sequences, on a consecutive basis, one of the current control voltage signals 132 to an active level "H" on a row at a time basis, during each active interval 130. The row decoder is not shown in the figure.

As previously described herein, due to the magnitude of the current control voltage signal applied to a selected row conductor, each source in the selected row generates an electron beam with a corresponding current. Due to proximity focusing, each electron beam bombards the second face of the feedthrough which overlaps the source.

It is believed that in operation, each feedthrough in the row p of feedthroughs being bombarded in the storage target with a respective electron beam will behave in a manner similar to what is described in the article, "The Barrier Grid Storage Tube" by D. J. Gibbons, Electronic Engineering, Oct. 1961. Applying a respective potential difference, between each electrode and the grid will shift the potential of every feedthrough which is overlapped by the electrode due to target capacitance resulting in an induced charge. This occurs during each blanking interval. Bombarding each feedthrough in a row p with a respective electron beam during the following active interval 130, by applying a current control voltage signal to a selected row conductor, allows the feedthroughs being bombarded to establish an equilibrium potential by the secondary emission charging action of the respective beam against the potential applied to the electrode overlapping the feedthrough. As a result, each pixel in the row p of feedthroughs being bombarded will acquire a net charge such that after bombardment it will have a potential proportional to the potential applied to the respective electrode which overlaps the feedthrough. It is further believed that the net charge will be opposite in sign to the potential applied. Sequentially activating row conductors, during consecutive active intervals, after an updated respective potential difference has been applied to each electrode and the grid during the preceding blanking interval, allows localized charge to be stored in the target on a row at a time basis.

Affixing column electrodes to a target by a suitable means, and varying the potential difference applied to each pixel of the target to vary the deformation of a reflective electrode overlapping the feedthrough of the pixel to vary the phase of the wavefront incident thereon is a suitable modulation means to vary the phase of a wavefront. As to be shown herein, alternative means exist to vary a property of an electromagnetic wavefront.

My invention allows the current control voltage signal to be maintained at a desired level for an active interval of a line period. This enhances several aspects of my invention over the prior art. Furthermore, due to the target configuration of my invention, additional degrees of freedom exist which could enhance the performance attainable in applications which utilize row at a time electron beam addressed storage targets. Increasing dwell time, to be equal to active line time, increases the time available to establish an equilibrium potential between the second face of each feedthrough in the row p of feedthroughs being bombarded by a respective electron beam and the electron collector grid. This is an important consideration since the ability to achieve an equilibrium values influences the amount of charge transferred to the target and the accuracy of the target's operation.

Increasing the dwell time could enhance the value of the "discharge factor" and/or allow additional latitude in establishing suitable values for other parameters in electron beam addressed displays, such as spot size, beam current, scan velocity, target capacity, etc while preserving the ability to achieve an equilibrium value. Information concerning discharge factor and display parameters effecting it, as applied to serial scanned devices, are well understood by those knowledgeable in the state of the art. Latitude in establishing values for parameters which effect discharge factor is an especially important consideration for high resolution displays.

Additional benefits are derived from increasing the dwell time of electron beam addressed storage targets. Increasing the dwell time of an electron beam with a particular beam current could extend the range of voltages over which a pixel could operate. Increasing the voltage range over which a pixel could operate could allow different types of material to be considered when configuring a storage target for certain applications. For instances, piezoelectric wavefront phase modulators exhibit several desirable attributes. See for instance information in the patent application submitted to Craig D. Engle title "Two Independent Spatial Degree of Freedom Wavefront Modulator". Increasing the scope of material selection for a storage target is fundamental to expanding the target configuration options. Increasing the number of storage target configurations available for a particular application could enhance the performance attainable in such applications.

Increasing the dwell time of electron beam addressed storage targets could allow a reduction in the bandwidth requirements for the target components. The benefits concerning band width reduction for the storage target of my invention are similar to the benefits provided by row at a time addressing of displays utilizing thin film transistors. Such benefits are well understood by those knowledgeable in the state of the art. For example, reducing bandwidth requirements of target components could allow the reductions in the dimension of the column electrodes, which could enhance spatial resolution of the display.

Due to the method of operation of the storage target of my invention, uniformity required from a row addressed array of electron beam sources is reduced when compared to alternative electron beam addressed storage target systems. This is attributed to increasing the dwell time and the method of equilibrium writing utilized in my invention to transfer charge to the storage target. If the dwell time exceed the maximum charge time, due to the lowest emission source charging to the peak voltage level, then variations in charge time due to source nonuniformities will be neutralized within a line time, allowing appropriate equilibrium charge levels to exist for the remaining frame time. Consequently, for large format displays, source nonuniformities are reduced in their significance thereby allowing more latitude to be extended to other array considerations.

Reducing the uniformity requirement of a row a time addressed electron beam source array could allow more freedom to be available when attempting to establish suitable operating parameters. For instance, as well understood by those knowledgeable in the state of the art, technique to compensate for nonuniformities in field emitter arrays could include increasing the number of field emitters associated with each pixel, ie redundancy. Utilizing my invention, to reduce the effects of nonuniformities, could eliminate the need for redundancy. Eliminating the need for redundancy could enhance spatial resolution by reducing the dimensions associated with each electron beam source. Such techniques could enhance spatial resolution of my invention.

Furthermore, use of my invention allows field emitter arrays to be row addressed. Row addressing of field emitter arrays simplifies electrode structuring in the field emitter arrays when compared to "X-Y Matrix Addressed" field emitter arrays, such as those utilized in U.S. Pat. No. 5,196,767. Simplifying the electrode structuring of field emitter arrays could enhance reliability associated with field emitter arrays. Such technique could enhance the commercial viability of applications utilizing my invention thereby enhancing the commercial viability of field emitter arrays.

In addition, as to be addressed herein, utilizing the target configuration of my invention allows a variety of well established electron beam sources to be utilized. The flexibility of my invention could have a significant impact on the packaging configuration of electron beam addressed spatial light modulators. Utilizing a compact electron beam source, such as a field emitter array, configured for row at a time addressing, could enhance packaging considerations and promote the commercial viability of my invention over alternative electron beam addressed spatial light modulators. Packaging advantages of field emitter arrays are identified in U.S. Pat. No. 3,500,102 to Crost et al, Mar. 10, 1970.

Additional benefits of my invention include combining the write/erase operation at each pixel, simplifying packaging by eliminating extraneous electron beam sources and/or enhancing luminous efficiency over prior art.

Figures 6, 7:
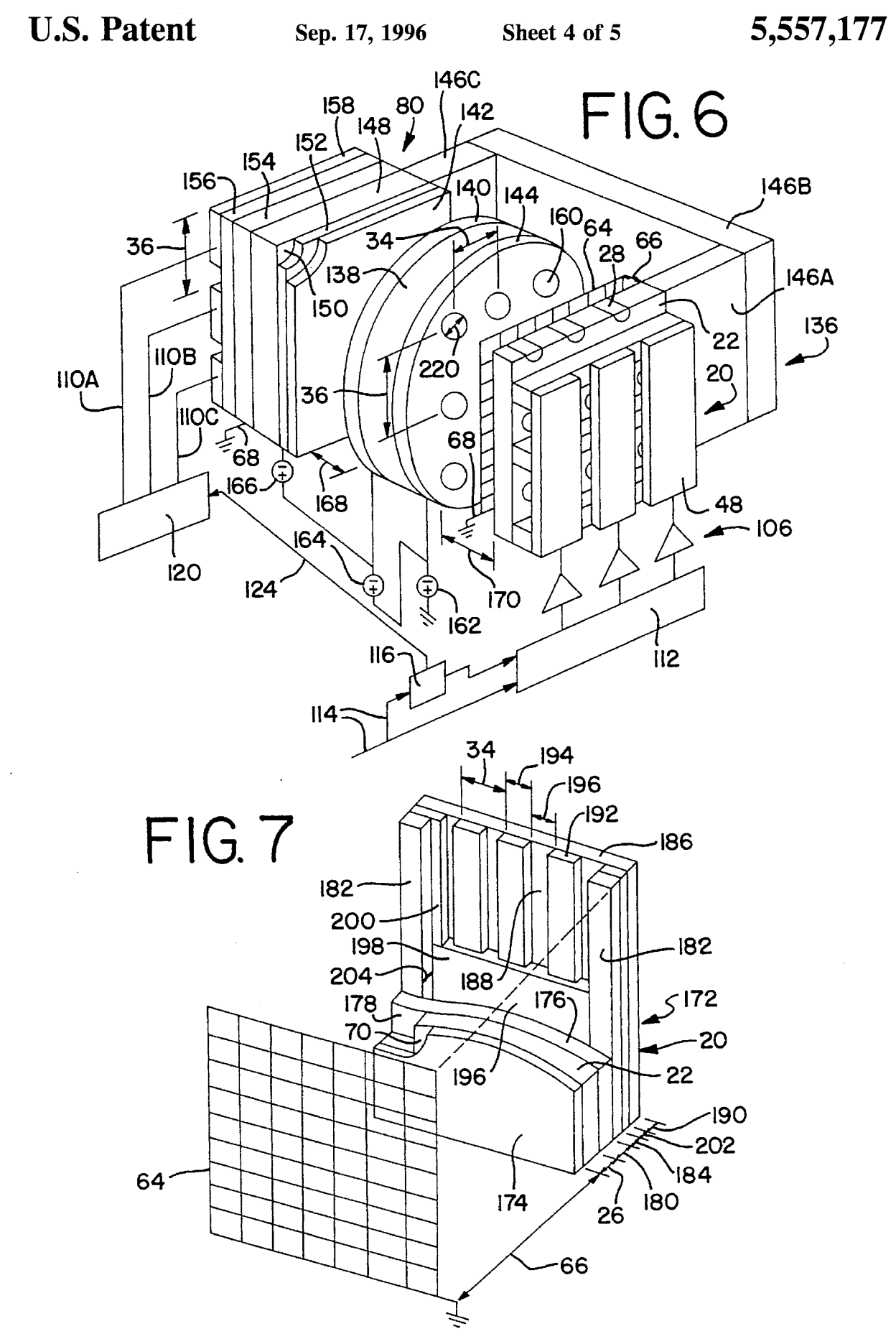

Additional suitable electron beam means exist. FIG. 6 shows a suitable electron beam means 80 interfaced to storage target 20 forming a spatial light modulation 136. Applications for modulator 136 could include a HDTV projection display device. Means 80 further includes a microchannel plate (MCP) 138. As well understood by those knowledgeable in the state of the art, MCP 138 is a thin wafer of a porous semiconductor glass. At each of its major surfaces, a conductive coating, to serve respectively as a first electrode 140, to receive electrons from a photocathode 142, and a second electrode 144, to interact with the first electrode 140 to create an electric field in the porous semiconductor glass from first electrode 140 to the second electrode 144 there being amplification in the number of electrons so that there is an amplified electron image at second electrode 144 of the spatial distribution of photoelectrons emitted by photocathode 142. The electric field is not shown in the figure.

Suitable means 80 further includes a plurality of vacuum housing side walls 146 and an input transmissive faceplate 148. Housing side walls 146 are shown in part to reveal features of my invention. Affixed to a first surface 150 of faceplate 148 is a transmissive photocathode electrode 152. Photocathode 142 is affixed to electrode 152 by a suitable means. Means to affix a photocathode to an electrode and suitable means to affix an electrode to a transmissive faceplate are well understood by those knowledgeable in the state of the art. Information concerning materials suitable for use as transmissive electrodes and photocathodes are provided in the reference cited herein.

Affixed to a second major surface of faceplate 148 is a transmissive common electrode 154. Electrode 154 is maintained at ground potential by ground interconnect 68. The second major surface of faceplate 148 is not visible in the figure. Affixed to transmissive electrode 154 is an electroluminescence material layer 156.

Affixed to layer 156 is a plurality of row conductors 158. Adjacent row conductors 158 are displaced by period 36. Each row conductor 158 is electrically connected by a general purpose interconnect 110 to row decode module 120. Clock means 116 provides a second synchronization signal 124 to row decode module 120. Decode module 120 applies, in secession, in response to signal 124 from clock means 116, a row activate signal to each row conductor 158. The activate signal varies the potential applied to the selected row conductor 158 thereby creating a potential difference across the portion of the layer 156 which lies underneath the activated row conductor 158 and between the common electrode 154.

As well understood by those knowledgeable in the state of the art, the portion of layer 156 lying underneath the activated row conductor 158 will emit light as a function of the applied potential difference. Operation of an electroluminescence interface with row conductor is described in U.S. Pat. No. 3,046,540 to F. A. Litz et al, Jul. 24, 1962. Additional information concerning electroluminescence material can be found in the article title DC Electroluminescence in Zinc Sulfide Films by W. A. Thornton, Journal of Applied Physics, Vol. 33, No. 10, Oct. 1962 and section 3 page 87 of the book titled Electronic Image Storage.

Due to the relative proximity of layer 156 relative to photocathode 142, a spatial distribution of light, due in part to the geometry of the row conductor 158, will be incident upon photocathode 142. As well understood by those knowledgeable in the state of the art, photocathode 142 provides an electron image of the spatial distribution of light incident upon on the photocathode 142.

MCP 138 is shown containing a plurality of pores 160. Pores 160 are arranged into a matrix of p rows and q columns. Adjacent pores 160 in each column q are displaced by period 36. Adjacent pores 160 in each row p are displaced by period 34. Each pore 160 further includes a pore diameter 220.

A first bias source 162 establishes an acceleration potential between electrode 144 and grid 64. A second bias source 164 establishes a potential difference between electrode 140 and electrode 144 of MCP 138. A third bias source 166 establishes a potential difference between electrode 152 and electrode 140 to draw the photoelectrons generated by illuminating photocathode 142 across a vacuum gap 168. Gap 168 is relatively small so that photoelectrons emitted by the photocathode are proximity focused onto the MCP.

Typical gap dimensions are found in U.S. Pat. No. 4,481,531 to Warde et al, Nov. 6, 1984.

The amplified electron image created by MCP 138 is proximity focused onto the second surface of substrate 22 of target 20. The second surface is not visible in the figure. Electrode 144 is separated from the second surface of substrate 22 by a proximity focus distance 170.

Bias source 162 is chosen to draw the amplified electron image from MCP 138 toward grid 64 with an acceleration potential which allows electrons to be accelerated to primary energies that lie between the first and second crossover points of the secondary electron emission ratio curve for the feedthroughs 28 of target 20. Row conductors 158 are positioned relative to electrode 140 and pores 160 of MCP 138 so that activating each row conductor 158 will generate a row of photoelectrons which will result in an amplified image row of electrons at electrode 144. Use of row conductors with an electroluminescence layer sandwiched between the row conductors is a suitable means to excite a row of photoelectrons from the photocathode. As to be described herein, alternative means exist to generate a row of photoelectrons from the photocathode.

MCP 138 is positioned relative to substrate 22 such that every pore 160 in each row p of MCP 138 is overlapped by the second face of a respective feedthrough 28. Due in part to relative positioning, activating, in secession, in a particular sequence, each row conductor 158 generates a plurality of electron beams which bombards target 20 on a row at a time basis.

Target 20 behavior and operation is similar to what has been previously discussed for an electron beam means utilizing a row addressed field emitter array. Suitable potential control means 106 is provided to establish a respective potential difference between each electrode 48 and grid 64. Separation distance 66 is chosen so grid 64 collects secondary electrons from target 20. Clock means 116 distributes a first synchronization signal 118 to shift register means 112 to enable synchronization of the activation of row conductors 158 with operation of potential control means 106. This allows charge to be deposited at each feedthrough 28 in every row p of target 20 on a row at a time basis which is dependent upon video signal 114 in an analogous manner to what has been previously described.

Transmission of substrate 22 could be chosen to block light from the electroluminescence layer to prevent mixing of "read light" and "write light."

Although row conductors were interfaced to an electroluminescence layer to assist in generating each row of electron beam sources, alternative techniques could be utilized to irradiate a photocathode and generate a row of electron beams. Such optical techniques could include a properly configured laser diode array. Laser arrays which could be utilized with my invention are described in the article "Surface-Emitting microlasers for Photonic Switching and Interchip Connections" by J. L. Jewell et al, Optical Engineering/March 1990/ Vol. 29 No. 3. Modifications to laser arrays, to allow row at a time addressing, so as to be compatible with my invention, are well understood by those knowledgeable in the state of the art. Additional means to optically address a photocathode to generate rows of photoelectrons are described in the reference cited herein.

Additional modifications to a MCP electron beam means could include a fiber optic faceplate to couple the spatial distribution of light to the photocathode. Such techniques are well understood by those knowledgeable in the state of the art. See for instance U.S. Pat. No. 4,741,692 to Hara et al, May 3, 1988. Amplifications levels of a MCP consistent with the light levels generated from activating a row conductor to generate the desired beam current in each respective electron beam bombarding the target are well understood by those knowledgeable in the state of the art.

FIG. 7 shows an alternative configuration for target 20. Target 20 is configured to provide a twisted nematic light crystal cell 172. Target 20 further includes a transmission insulating substrate 22. Materials suitable for use as a transmissive, insulating substrate are well understood by those knowledgeable in the state of the art. Affixed to second face 70 of substrate 22 by a suitable means is a dielectric reflector 174. Suitable means to affix dielectric reflectors to a substrate are well understood by those knowledgeable in the state of the art.

Reflector 174 exhibits a secondary electron emission ratio curve similar to the curve in FIG. 3. Affixing dielectric reflector 174 to substrate 22 provides a suitable secondary emission means and a suitable reflective means for use with target 20.

Affixed to the first surface of substrate 22 by a suitable means is a first liquid crystal alignment layer 176. The first surface of substrate 22 is not visible in the figure.

Materials suitable for use as an alignment layer 176 are well understood by those knowledgeable in the state of the art. Layer 176 could be silica dioxide, similar to what is described in U.S. Pat. No. 4,387,963. Alternatively, layer 176 could be magnesium fluoride processed as described in U.S. Pat. No. 3,853,391, to Sorkin, Dec. 10, 1974. Layer 176 further includes a first major surface and a second major surface 178. The first major surface of layer 176 is not visible in the figure. Surface 178 and the first major surface of layer 176 are separated by an alignment layer thickness 180. Thickness 180 is parallel to thickness 26. Layer 176 is processed to establish a preferred alignment direction. Several techniques are available to establish the preferred alignment direction of layer 176. Details of the alignment direction of layer 176 are not shown for convenience.

Affixed to the first surface of layer 176 is a sealing gasket 182. Portions of gasket 182 have been shown cut away to reveal features of my invention. Gasket 182 further includes a gasket thickness 184. Thickness 184 is parallel to thickness 26.

Target 20 further includes transmissive window 186. Window 186 further includes a first major surface and a second major surface 188. The first surface is not visible in the figure. Surface 188 and the fist surface are essentially parallel planes separated by a window thickness 190. Thickness 190 is perpendicular to surface 188 and parallel to thickness 26. Affixed to surface 188 by a suitable means is a plurality of transmission column electrodes 192. Electrodes 192 could be fabricated from tin doped indium oxide. Suitable means for affixing transmissive electrode 192 to surface 188 are well understood by those knowledgeable in the state of the art and could include sputtering. Adjacent electrodes 192 are displaced by period 34. Column electrodes are given a different designation number in this figure to emphasize that the column electrodes differ than in previous configurations by being transmissive and the method of affixing column electrodes to the substrate. Each electrode 192 further includes an electrode width 194. Width 194 is parallel to period 34. Adjacent electrodes are separated by a gap 196. Gap 196 is parallel to period 34.

Affixed to surface 188 by a suitable means and overlaying every electrode 192 is a second alignment layer 198. Layer 198 further includes a first major surface and a second major surface 200. The first major surface of layer 198 is not visible in the figure. Surface 200 and the first surface of layer 198 are separated by an alignment layer thickness 202. Due to the presence of electrodes 192, thickness 202 will vary as a function of location on surface 188.

Layer 198 is processed to establish a preferred alignment direction. Several techniques are available to establish a preferred alignment direction of layer 198. Such techniques are well understood by those knowledgeable in the state of the art and could be similar to the techniques utilized for layer 176. Materials utilized for layer 198 could be similar to the materials utilized for layer 198.

Target 20 further includes grid 64 separated from surface 70 by separation distance 66.

Gasket 182 is affixed to the first surface of alignment layer 176 and surface 200 of alignment layer 198. The first surface of layer 176 is separated from surface 200 of layer 198 by a liquid crystal cell thickness 204. Thickness 204 is parallel to thickness 26 and is essentially equal to gasket thickness 184. A liquid crystal is disposed into the volume of cell 176 created by separating layer 198 and layer 176 with sealing gasket 182. The liquid crystal is not shown in the figure. Techniques for filling and sealing a liquid crystal cell, with a liquid crystal, and materials used for items in constructing a liquid crystal cell, such as materials utilized for the gasket, window, liquid crystals alignment by those knowledgeable in the state of the art. See for instance information in U.S. Pat. No. 4,387,964.

Affixing transmissive column electrodes to a transmissive window, and affixing the window to the target substrate, by the use of gasket and alignment layers, is a suitable means to affix column electrodes to a substrate. Affixing electrodes to a substrate of the target is a suitable means to affix electrodes to the target. Affixing the window to the substrate by use of alignment layers and a gasket, in the manner described herein is a suitable means to affix a window to substrate 22 of target 20.

In twisted nematic liquid crystal cell 172, alignment layer 198 and alignment layer 176 are treated so that liquid crystals molecules near the alignment layers will align themselves with their longitudinal molecular axes parallel to the preferred alignment directions. The preferred alignment directions of layers 198 and layer 176 are parallel and are oriented such that the preferred alignment direction of one layer is rotated approximately 45 degrees to the preferred alignment direction of the other layer. The alignment layers generate homogeneous alignment. Use of a first alignment layer and a second alignment layer to influence the molecular orientation of the liquid crystal is a suitable alignment means. As well understood by those knowledgeable in the state of the art, alternative suitable alignment means exist and could include rubbing surfaces in the preferred alignment direction.

A wavefront to be modulated is incident on the first surface of window 186. The wavefront is not shown in the figure for convenience. As well understood by those knowledgeable in the state of the art, the polarization state of the incident wavefront is an important consideration for modulating the polarization state of an incident wavefront with a twisted nematic liquid crystal cell. The incident wavefront is plane polarized with its plane of polarization coinciding with the preferred alignment direction of layer 198. Techniques for establishing a plane polarized wavefront for use with my invention are well understood by those knowledgeable in the state of the art. See for instance information in U.S. Pat. No. 4,387,964. The incident wavefront is linearly polarized along the direction of the preferred alignment direction of layer 198.

In an unenergized state, the wavefront traverse cell 172 and the plane of polarization is rotated by a 45 degree twist due to the orientation of the alignment direction of layer 176 relative to the alignment direction of layer 198. The wavefront traverses substrate 22 in a direction parallel to thickness 26, is incident on reflector 174, reverses direction of propagation and traverses cell 172 a second time and untwists the plane of polarization then exists target 20.

To spatially vary the polarization state of the incident wavefront, localized electric fields are applied to cell 172 along a direction parallel to thickness 26. The localized electric fields are not shown in the figure. As well understood by those knowledgeable in the state of the art, varying each localized electric field varies the twist characteristics across the liquid crystal in a localized region which varies the birefringence. Varying the birefringence of the liquid crystal in cell 172 varies the polarization state of the wavefront traversing the liquid crystal cell 172. As well understood by those knowledgeable in the state of the art, an analyzer could be employed with the wavefront exiting the cell to vary the light transmitted through the analyzer. An analyzer could be utilized in an optical projection system. Such techniques are well understood by those knowledgeable in the state of the art and are not shown in the figure for convenience. See for instance U.S. Pat. No. 4,387,964.

Row at a time electron beam addressing of target 20 is utilized to establish localized electric fields in target 20 which lie along a direction parallel to thickness 26. To established a localized electric field on a row at a time basis in target 20, reflector 174 is bombarded with a plurality of electron beams from a suitable electron beam means as described herein. Suitable electron beam means further includes a row addressed electron beam source. Suitable electron beam means to bombarded target 20 with a plurality of electron beams, along with the suitable potential control means and other considerations, such as synchronization means, scan means, etc to establish a localized electric field in target 20 on a row at a time basis have been described herein.

When utilizing a target which incorporates a dielectric reflector as the suitable secondary electron emission means, as in the case of the liquid crystal cell, the plurality of electron beam bombarding the dielectric reflector of the target are positioned relative to the target so the beam landing area of each electron beam is overlapped by a respective transmissive electrode. In addition, due to proximity focusing etc, the beam landing areas of adjacent electron beams on the dielectric reflector are displaced by the first period, so as to allow row at a time electron beam addressing. Having the beam landing area of each electron beam overlapped by a respective transmissive column electrode utilizing the electron beam means described herein allows a localized charge to be deposited on the dielectric reflector at the beam landing area of each electron beam in a manner similar to what was described for use with feedthroughs functioning as the secondary emission means.

Due to the relative positioning of the beam landing areas of adjacent electron beams, localized charge acquired at the beam landing areas, dependent upon the potential difference between the grid and the electrode overlapping the beam land area, establishes a localized electric field in the target.

Operation of a row at a time electron beam addressed target utilizing a dielectric reflector is similar for previous target configurations. Each electrode in conjunction with the beam landing area of a respective beam effectively establishes a target pixel. Due to charging behavior associated with bombarding the secondary emission means, the target acquires, in parallel, a total charge which is dependent upon the respective potential difference of each electrode and the grid. Since charge is deposited at the beam landing are of each electron beam as previously described, this effectively allows a localized target pixel to be established between the beam landing area of each electron beam and the electrode which overlaps the beam landing area. The charge acquired by each pixel in the row bombarded by the plurality of electron beams establishes a respective localized electric field in the liquid crystal cell. As well understood by those knowledgeable in the state of the art, varying a localized electric field varies the birefringence of the cell which varies the polarization state of the wavefront traversing the cell. As identified in the references provided herein, applications for such a device could include HDTV projection displays.

A suitable scan means is provided to position the beam landing areas of a plurality of electron beams bombarding the target along a direction perpendicular to the first period and the thickness of the substrate. Adjacent positions for the beam landing area due to scanning should be greater than the beam landing area to assist in the isolation of each pixel, i.e. adjacent rows of beam landing areas are separated by an amount that allows each beam landing area to be effectively isolated. Such considerations are important and could effect redistribution of the secondary electrons which could effect the ability to establish a localized response in the target.

FIG. 8 shows a storage target 20 which utilizes an electro-optic substrate 22. Affixed to the second surface of electro-optic substrate 22 is a dielectric reflector 174. The second surface of substrate 22 is not visible in the figure. Affixed to first surface 24 of substrate 22 is a plurality of transmissive column electrodes 192. Adjacent electrodes 192 are separated by period 34. Affixing column electrodes to the first surface of an electro-optic substrate is a suitable means to affix column electrodes to the target. A electron collector grid 64 is separated from substrate 22 by a separation distance 66.

Materials suitable for use as electro-optic substrates could include DKDP. Orientation of the substrate's electro-optic axes (X,Y) are oriented at 45 degrees to the crystallographic axes (X',Y'). Additional information concerning DKDP can be found in the article "E-Beam DKDP Light Valves" by David Casasent, Optical Engineering, Vol. 17 No. 4, July August 1978. A transmissive window 206 is affixed by a suitable means to target 20. The window is shown cutaway for clarity. Suitable means for affixing a transmissive window to an electro-optic substrate can be found in the article titled "Pockels-Effect Imaging Devices and Their Applications." G. Marie et al, pages 225–303. Purpose of the window are identified in the references provided and are well understood by those knowledgeable in the state of the art. A Peltier cell, for controlling the temperature of the target, could be utilized but is not shown for clarity. Such techniques are well understood by those knowledgeable in the state of the art.

Additional electro-optic substrate materials suitable for use in my invention are identified in the references cited herein. A pane wavefront linearly polarized along X' is incident upon window 206 of target 20. The wavefront is not shown for clarity. The wavefront traverses substrate 20 is incident upon reflector 174, reverses direction and traverses the substrate 22 a second time and exists target 20.

Charging of target 20, when utilizing an electro-optic substrate, is similar to what has been previously described for other storage targets which utilize a dielectric reflector. A suitable electron beam means is provided to bombard the dielectric reflector with a plurality of electron beams. The beam landing area of each electron beam is overlapped by a respective column electrode. The beam landing areas are not visible in the figure. As well understood by those knowledgeable in the state of the art, the beam landing area of each electron beam influences spatial resolution of target. Each beam landing area in conjunction with the respective column electrode overlapping the beam landing area form a respective target pixel. Target pixels are not shown in the figure.

Charging of every pixel in each row p due to bombarding the dielectric reflector with a plurality of electron beams is similar to the charging action previously described for targets which employed feedthroughs. A charge is deposited at the beam landing area of each electron beam which is dependent upon the potential difference between the respective electrode which overlaps the beam landing area and the grid. The localized charge at each beam landing area established a localized electric field in the target. Varying the electric field at each localized region in the target varies the local birefringence of the substrate. Varying the birefringence of the substrate could vary the polarization state of a wavefront which is incident upon the target.

Polarization orientation of the incident wavefront, relative to the crystallographic axes of the substrate, and other components such as projection optics and an analyzer need for interfacing to the target for use in a variety of applications are well understood by those knowledgeable in the state of the art and are not shown.

Varying the birefringence of an electro-optic crystal, to vary the polarization state of a wavefront which traverses the target, is a suitable modulation means for the target to vary the polarization state of an incident wavefront. As well understood by those knowledgeable in the state of the art, several crystals exhibit the longitudinal electro-optic effect or Pockels effect and could be utilized as the substrate in my invention, to vary a property of an incident wavefront in my invention. As identified in the reference cited herein, electro-optic substrates could also be utilized to vary the phase of an electromagnetic wavefront.

An important distinction when utilizing a dielectric reflector for the suitable reflective means is that the beam landing area of each electron beam assists in establishing a respective pixel. This is similar to the utilization of feedthroughs, although in the feedthrough case the diameter of the end face of a feedthrough assists in establishing the localized region in the target. As previously described herein, spacing between the beam landing areas associated with adjacent rows of beam landing areas is chosen to allow the charge deposited at each beam landing area to establish a localized response in the target.

FIG. 9 shows a target 20 which utilizes an electro-optic substrate 22 which exhibits a transverse electro-optic effect. Materials suitable for use as an electro-optic substrate include suitable compositions of PLZT. Compositions of PLZT which exhibit a transverse electro-optic effect are well understood by those knowledgeable in the state of the art. Material compositions suitable for use in the target configuration of my invention are identified in the article "Photoconductive Activated Light Valve for High Definition Projection System" by Garth Gobeli, SPIE Vol. 1664, High Resolution Displays and Projection Systems, 1992.

A plurality of U shaped column electrodes 208 are affixed to first surface 24 of electro-optic substrate 22. Adjacent U shaped electrodes are displaced by first period 34. Each U shaped electrode 208 further includes a pair of vertical segments 210 electrically connected by a respective horizontal segment 212. Vertical segments 210 of each U shaped electrode 208 are separated by a clear aperture distance 214. Distance 214 is parallel to period 34.

Affixed to the second surface of electro-optic substrate 22 is a plurality of optically reflective conductors 216 arranged into a matrix of p rows and q columns. Adjacent conductors 216 in each column q are displaced by second period 36. Adjacent conductors 216 in each row p are displaced by period 34. Each conductor 216 further includes a pad width 218. Width 218 is essentially parallel to period 34. Conductors 216 are positioned relative to the U shaped column electrode so that every conductor 216 in each column q of conductor 216 is straddle by a respective U shaped column electrode 208.

As identified in U.S. Pat. No. 4,222,638 to Robert, Sep. 16, 1980, "The invention is highly advantageous in practice since it has been shown in the first place that the birefringence induced by the diagonal field is only slightly lower than the birefringence induced by an electrical field parallel to the surface of the plate, at least in the case of plate thickness of the same order as the distance between consecutive strips and in the second plate that the transmitted light intensity exhibits considerable non-linear variation according to the voltage applied." Consequently, positioning of conductors relative to a respective column electrode so each column q of conductors is straddle by a respective column electrode is a suitable relative positioning means for establishing a localized response between each conductor and a respective U shaped electrode.

Each conductor 216 exhibits secondary emissions characteristics similar to the curve shown in FIG. 3. Utilizing conductors 216 provides target 20 with a suitable secondary electron emissions means and a suitable reflective means. Grid 64 is separated from substrate 22 by a separation distance 66. Suitable conductors could include Silver or Gold, ie, Ag or Au depending upon the spectral region of use.

Operation of a target utilizing a transverse electro-optic effect is similar to operation of other targets described herein. A suitable electron beam means is provided to bombard each pad in every row p on a row at a time basis with a respective electron beam. The suitable electron beam means further includes a suitable potential control means to establish between each electrode and the grid a respective potential difference. Straddling each column q of conductors with a respective electrode allows localized electric fields to be established in target 20 on a row at a time basis due to charge acquired by the conductor 216 of each pixel.

Varying the charge deposited on target 20 varies a property of the incident electromagnetic wavefront. As well understood by those knowledgeable in the state of the art, utilizing a planer wavefront linearly polarized in a direction parallel to vertical segments allows polarization rotation modulation. Accordingly, the storage target of my invention could utilize electro-optic materials which exhibit transverse electro-optic effects and/or kerr effects to vary the polarization state of an incident wavefront by a suitable means.

FIG. 10 shows a preferred embodiment of my invention. Target 20 is configured as a twisted nematic liquid crystal cell 172 and utilizes a plurality of optically reflective conductors 216 affixed to second surface 70 of substrate 22. Conductors 216 are arranged into a matrix of p rows and q columns. Adjacent conductors 216 in each row p are displaced by period 34. Adjacent conductors 216 in each column q are displaced by period 36. Portions of target 20 are shown cut away for clarity.

Construction of cell 172 is similar to what has been previously described for a liquid crystal cell. Cell 172 further includes a first alignment layer 176 affixed to substrate 22. Affixed to second surface 188 of transmissive window 186 by a suitable means is a plurality of transmissive column electrodes 192. Adjacent electrodes 192 are displaced by period 34. Each column q of conductors 216 is overlapped by a respective electrode 192. Overlapping every electrode 192 and affixed to second surface 188 of window 186 is second alignment layer 198. First alignment layer 176 and second alignment layer 198 are processed to produce homogeneous alignment. First alignment layer 176 is processed so that liquid crystal molecules near the first surface of layer 176 will align themselves with their longitudinal molecular axes parallel to the preferred alignment direction. Layer 198 is processed so that liquid crystal molecules near surface 200 will align themselves with their longitudinal axes parallel to the preferred alignment direction. The preferred alignment direction of layer 176 is parallel to the preferred alignment direction of 198 and is rotated approximately 45 degrees relative to the orientation of the preferred alignment direction of layer 198. This suitable alignment means has been previously described. The first surface of layer 176 is not visible in the figure. The preferred alignment directions are not shown in the figure for convenience.

A gasket 182 is affixed to the first surface of layer 176 and second surface 200 of layer 198 separating layer 176 from layer 198 by a liquid crystal cell thickness 204. Thickness 204 is parallel to a gasket thickness 184. A nematic phase liquid crystal is disposed into the volume of cell 172 created by separating layer 176 from layer 198. The liquid crystal is not shown in the figure.

Affixed to second surface 70 of substrate 22 is a plurality of optically reflective conductors 216. Each conductor 216 further includes a first conductor face and a second conductor face 220. The first conductor face is not visible in the figure. The first conductor face and face 220 are essentially parallel planes separated by a conductor thickness 222. Thickness 222 is parallel to thickness 26. Affixed to second face 220 of each conductor 216 is a respective high yield secondary electron emissions dielectric layer 224. Each layer 224 could be magnesium oxide. Each layer 224 could be A1203.

Layer 224 further includes a first dielectric layer face and a second dielectric layer face 226. The first dielectric layer faces are not visible in the figure. The first dielectric layer face and face 226 are essentially parallel planes separated by a layer thickness 228. Thickness 228 is perpendicular to face 226 and parallel to thickness 26. Materials suitable for use as optically reflective conductors in cell 172 and other embodiments of my invention could include Ag or Au. Techniques for affixing optically reflective conductors to a substrate are identified in the reference cited herein.

As identified in the patent application submitted by Craig D. Engle titled "Enhanced Electron Beam Addressed Liquid Crystal Device", several benefits could be realized in the twisted nematic liquid crystal cell when utilizing a plurality of optically reflective conductors as the reflective means. As identified in the above mentioned patent application, optically reflective conductors could extend the spectral reflectance band of operation of a twisted nematic electron beam addressed liquid crystal cell. The application title Enhanced Electron Beam Addressed Liquid Crystal Device is officially incorporated herein as reference.

Increasing the spectral reflectance band is an especially important consideration for twisted nematic liquid crystal cells due to the broad spectral response inherent to the twisted nematic effect. In a manner analogous to what is cited in the reference, a broad spectral response could allow for a single target tricolor cell configuration which could simplify the implementation of a tricolor display systems. Additional benefits of utilizing a broad spectral reflectance band could include increasing the efficiency of operation of the liquid crystal cell.

Operation of target 20 is similar to what has been previously described herein. A suitable electron beam means is provided to bombard the respective dielectric layer 224 affixed to every conductor 216 in each row p on a row at a time basis. A wavefront to be modulated is incident upon the first surface of window 186. The first surface of window 186 and the wavefront are not visible in the figure. As previously described herein, the plane of polarization of the incident plane wavefront is parallel to the preferred alignment direction of layer 198.

Techniques for orientating the plane of polarization of the incident wavefront are described in the references provided herein. The wavefront traverses cell 172 in a direction parallel to thickness 26. The wavefront is incident upon the optically reflective conductors 216, reverses direction of propagation, transverses cell 172 a second time and exist target 20. The suitable electron beam means applies a charge to the respective layer 224 affixed to every conductor 216 in each row p on a row at time basis as a function of the potential difference between the electrode 192 which overlaps the conductor 216 and grid 64 which is separated from surface 70 by distance 66. Varying the charge applied to the layer 224 affixed to a conductor 216 varies as electric field between the layer 224 and the respective electrode 192 overlapping the layer 224. The electric fields lie along a direction parallel to thickness 26. The electric fields are not shown in the figure.

As well understood by those knowledgeable in the state of the art, varying the electric field in a twisted nematic liquid crystal cell varies the twist characteristic of the liquid crystal molecules from the twist state which exists in the unenergized state, or the state when the electric field is zero. Varying the twist characteristics varies the birefringence of the cell which varies the polarization state of the wavefront traversing the cell.

Additional benefits of utilizing optically reflective conductors in a liquid crystal cell are provided in the reference cited herein. Since row at a time addressing of my invention increases dwell time, the high yield secondary electron emissions dielectric layers may not be necessary to achieve an equilibrium potential between each respective layer and the grid. This could simply fabrication of the cell. Layers are described to emphasize the flexibility in my invention. If dielectric layers are utilized for establishing a high yield secondary electron emission ratio, then optically reflective conductors can be chosen on the basis of the spectral reflectance band the conductor provides. As identified in the references provided herein, this could increase the options available for use in my invention. As can be seen, the advantages of optically reflective conductors utilized with a twisted nematic liquid crystal cell which is row at a time electron beam addressed provides several benefits.

Conclusions, Ramification, and Scope of Invention

Thus the reader will see that the row at a time electron beam addressed storage target of my invention provides several advantages. While my description contains many specificities, these should not be construed as limitations on the scope of the invention, but rather as an exemplification of one preferred embodiment thereof. Many other variations are possible. For example a suitable electron beam means could include the use of a linear array of electron beam sources. A scanning means could be provided to deflect, by an electrostatic or electromagnetic deflection means, the linear array of electron beam across the secondary emission means affixed to target substrate. Examples of how this could be achieved could include the incorporation of deflection electrodes into a field emitter source. Such techniques are well understood by those knowledgeable in the state of the art, see for example U.S. Pat. No. 3,753,022 to Fraser, Jr. Aug. 14, 1973.

The preferred embodiment of my invention, the twisted nematic liquid crystal cell, could utilize several of the suitable reflective means identified herein. As an alternative, feedthroughs could be utilized, affixed in a manner similar to what has been described in the references cited herein. Such techniques represent a suitable reflective means for use with the liquid crystal cell.

As identified in the references cited herein, dielectric reflectors couple several variables which effect performance of an electron beam addressed target. These same considerations exist in a row at a time addressed target of my invention. Thickness of a dielectric reflector couples spectral reflectance band, which could effect efficiency when coupled to a broad band source, efficiency through voltage division, type of reflectance, ie specular versus diffuse, angles over which the cell could be utilized, and adversely effect resolution through fringing fields. As identified in the patent application titled "Enhanced Electron Beam Addressed Liquid Crystal Device" submitted to Craig D. Engle and officially incorporated herein as a reference, utilization of optically reflective conductors provides latitude to enhance an electron beam addressed device as compared to dielectric reflectors. This is the basis for identifying the twisted nematic cell which utilizes optically reflective conductors as the preferred embodiment of my invention.

As identified in the references cited herein, use of optically reflective conductors could reduce the voltage drop which occurs across the reflective means of the target of my invention when compared to dielectric reflectors previously identified, increasing dwell time offsets the lower peak emissions ratio that metal typically exhibit when compared to dielectric reflectors. Furthermore, use of a band spectral reflectance band associated with the optically reflective conductors in my invention could increase the efficiency of the storage target of my invention when interfaced to a broad band optical source. The benefits identified when utilizing optically reflective conductors could be utilized to enhance the performance of other targets utilized in the target of my invention, such as electrooptic substrates which utilize the Pockels effect.

In addition, materials suitable for use as the substrate in the preferred embodiment of my invention could include materials which function as quarter wave plates. See for example information in U.S. Pat. No. 3,972,587, to Scheffer. Additional information concerning the use of liquid crystals are various effects which could be utilized in reflective cells include information in the article "Development of a Spatial Light Modulator: A Randomly Addressed Liquid Crystal over NMos Array" by Douglas J. McKnight et al, 15 Nov. 1989/Vol. 28, No. 22/Applied Optics.

Accordingly, the scope of the invention should be determined not by the embodiments illustrated, but by the appended claims and their legal equivalents.

I claim:

1. A row addressed field emitter array electronic charge storage target device comprising:
   a vacuum environment,
   base electrode means,
   a plurality of non overlapping row electrodes generally extending along a first direction,
   each said row electrode overlaps said base electrode means,
   row decoder means to apply a current control voltage between a select one of said row electrodes and said base electrode means,
   a respective electron emitting means operatively associated with each said row electrode and said base electrode means for emitting in said vacuum environment a plurality of electrons dependent upon said current control voltage applied between the row electrode and said base electrode means by a field emission phenomena,
   target means comprising:
      a substrate,
      a plurality of reflective conductor means arranged into a matrix of p rows and q columns,
      support means to separate each said reflective conductor means from said substrate,
      said reflective conductor means in each column q are electrically connected,
      electron collector means,
   potential control means to apply between each said column q of electrically connected reflective conductor means and said collector means a respective potential difference,
   control means to synchronize application of said respective potential differences with application of said current control voltage between each one of said row electrodes and said base electrode means,
   acceleration means to enable said electrons emitted from any one of said respective emitting means to be accelerated toward said target means,
   focusing means to cause said electrons accelerated by said acceleration means to strike said target means at a respective emitting means image,
   equilibrium writing means enabling said respective potential difference applied between any one of said columns q of electrically connected reflective conductor means and said collector means to influence an electronic charge quantity accumulated by a respective pixel element formed where at least one of said reflective conductor means in the column q overlaps said emitting means image of where said focusing means has caused said accelerated electrons to strike said target means,
   each column q of electrically connected reflective conductor means overlaps each said respective emitting means image enabling said electronic charge quantity accumulated by said pixel elements formed with each said emitting means image to be collectively accumulated during a respective line period duration thereby providing compensation for variations in the number of said electrons striking said target means at each said emitting means image,
   said electronic charge quantity accumulated by each said pixel element influences separation between said substrate and said reflective conductor means forming said pixel element.

2. The device of claim 1 wherein varying said respective potential difference applied between each said column q of electrically connected reflective conductor means and said collector means varies said charge quantity accumulated at said pixel element formed where said reflective conductor means in the column q overlaps said emitter means image where said electrons strike said target means thereby varying separation between said reflective conductor means forming said pixel element and said substrate modulating a wavefront incident on said reflective conductor means.

3. A row addressed field emitter array charge storage target device comprising:
   a vacuum environment,
   base electrode means,
   a plurality of non-overlapping row electrodes generally extending along a first direction,
   each said row electrode overlaps said base electrode means,
   row decoder means to apply between a select one of said row electrodes and said base electrode means a current control voltage,
   a respective electron emitting means operatively associated with each said row electrode and said base electrode means to emit in said vacuum environment a plurality of electrons dependent upon said current control voltage applied between the row electrode and said base electrode means by a field emissions phenomena,
   target means comprising:
      a substrate,
      a plurality of non-overlapping column conductors generally extending along a second direction,
      each said column conductor is affixed to said substrate,
      electron collector means,
   potential control means to apply between each said column conductor and said collector means a respective potential difference,
   control means to synchronize application of said current control voltage between each one of said row electrodes and said base electrode means with application of said respective potential differences between said column conductors and said electron collector means,
   acceleration means to enable said electrons emitted from any one of said respective emitting means to be accelerated toward said target means,
   focusing means to cause said electrons accelerated by said acceleration means to strike said target means at a respective emitting means image,
   equilibrium writing means enabling said respective potential difference applied between any one of saidcolumn conductors and said collector means to influence an electronic charge quantity which is accumulated by a respective pixel element formed where said column conductor overlaps said emitting means image of where said focusing means has caused said accelerated electrons to strike said target means,
   said column conductors overlap each said respective emitting means image enabling said electronic charge quantity accumulated by said pixel elements formed with each said emitting means image to be collectively accumulated during a respective line period duration thereby enabling compensation for variations in the number of said electrons striking said target means at each said emitting means image.

4. The device of claim 3 wherein each said column conductor comprises a plurality of electrically connected reflective conductor means,
   each one of said electrically connected reflective conductor means overlaps said emitter means image of one of said respective pixel elements formed with said column conductor, support means to offset each said reflective conductor means from said substrate whereby said charge quantity accumulated by each said pixel element influence separation between the reflective conductor means overlapping said emitting means image of said pixel and said substrate thereby enabling modulation of a wavefront which is incident on said reflective conductor means.

5. The device of claim 3 wherein said substrate comprises an electro-optic material, reflective means integrally associated with said substrate, said column conductors are transmissive to a wavefront traversing said target means.

6. The device of claim 5 wherein said electro-optic material exhibits a pockels effect.

7. The device of claim 5 wherein said electro-optic material exhibits a kerr effect.

8. The device of claim 3 wherein said column conductors are affixed to a first major surface of a transmissive faceplate, said column conductors are transmissive to a wavefront traversing said target means, said first major surface of said faceplate faces said substrate, said faceplate is separated from and affixed to said substrate, means for disposing a layer comprising a liquid crystal material between said substrate and said faceplate, reflective means integrally associated with said substrate.

9. The device of claim 8 wherein said liquid crystal material comprises a nematic liquid crystal.

10. An enhanced electron beam addressed storage target device comprising:

a vacuum environment, target means comprising:
  a substrate
  electron collector means,
  a plurality of non-overlapping column conductors generally extending along a first direction,
  each said column conductor is affixed to said substrate, potential control means to apply between each said column conductor and said collector means a respective potential difference, electron source means enabling said target means to be bombarded at a select one of a plurality of electron beam landing areas with a plurality of electrons emitted from a respective output region of a microchannel plate amplifying means, each said beam landing area generally extending along a second target direction, control means for synchronizing application of said respective potential differences with bombardment of each said beam landing area with said electrons emitted from said respective output region, equilibrium writing means enabling said respective potential difference applied between any one of said column conductors and said collector means to influence an electronic charge quantity which is accumulated by a respective pixel element formed where said column conductor overlaps the selected one of said plurality of beam landing areas which is being bombarded with electrons emitted from said respective output region, said charge quantity accumulated by said pixel elements formed with each said beam landing area is accumulated during bombardment of the beam landing area forming the pixel elements with said plurality of electrons emitted from said respective output region, said column conductors overlap each said beam landing area enabling said charged quantity accumulated by said pixel elements formed with each said beam landing area to be collectively accumulated during a respective line period duration thereby providing compensation for variations in the number of said electrons striking said target means at each said beam landing area.

11. The device of claim 10 wherein each said column conductor comprises a plurality of electrically connected reflective conductor means, each one of said electrically connected reflective conductor means overlaps one of said beam landing areas of said pixel elements formed with said column of electrically connected reflective conductor means, support means to offset each said reflective conductor means from said substrate whereby said electronic charge accumulated by each said pixel element influences separation between the reflective conductor means overlapping said emitting means image of said pixel element and said substrate thereby enabling modulation of a wavefront which is incident on said reflective conductor means.

12. The device of claim 10 wherein each said substrate comprises an electro-optic material, reflective means integrally associated with said substrate, said column conductors are transmissive to a wavefront traversing said target means.

13. The device of claim 12 wherein each said electro-optic material exhibits a pockels effect.

14. The device of claim 12 wherein said electro-optic material exhibits a kerr effect.

15. The device of claim 10 wherein said column conductors are affixed to a first major surface of a transmissive faceplate, said column conductors are transmissive to a wavefront traversing said target means, said first major surface of said faceplate faces said substrate, said faceplate is separated from and affixed to said substrate, means for disposing a layer comprising a liquid crystal material between said substrate and said faceplate, reflective means integrally associated with said substrate.

16. The device of claim 15 wherein said liquid crystal material comprises a nematic liquid crystal.

* * * * *